(12) United States Patent
Nishizono et al.

(10) Patent No.: US 10,361,609 B2
(45) Date of Patent: Jul. 23, 2019

(54) ELECTRONIC DEVICE

(71) Applicant: RENESAS ELECTRONICS CORPORATION, Tokyo (JP)

(72) Inventors: Shinji Nishizono, Tokyo (JP); Tadashi Shimizu, Tokyo (JP); Norikazu Motohashi, Tokyo (JP); Tomohiro Nishiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 72 days.

(21) Appl. No.: 15/629,261

(22) Filed: Jun. 21, 2017

(65) Prior Publication Data

US 2017/0373567 A1     Dec. 28, 2017

(30) Foreign Application Priority Data

Jun. 23, 2016 (JP) ................ 2016-124388

(51) Int. Cl.
*H05K 1/18* (2006.01)
*H02K 11/33* (2016.01)
(Continued)

(52) U.S. Cl.
CPC ............. *H02K 11/33* (2016.01); *H02H 9/02* (2013.01); *H02K 7/145* (2013.01); *H02M 7/003* (2013.01); *H02P 6/085* (2013.01); *H05K 1/0263* (2013.01); *H05K 1/115* (2013.01); *H05K 1/181* (2013.01); *H05K 7/1432* (2013.01); *H02H 7/08* (2013.01);
(Continued)

(58) Field of Classification Search
CPC .......... H02H 9/02; H02K 11/33; H02K 7/145;
H05K 1/0206; H05K 1/115; H05K 1/181;
H05K 2201/10522; H05K 2201/10545;
H05K 3/3447; H05K 3/429; H05K
1/0263; H05K 2201/10015; H05K
2201/10166;
(Continued)

(56) References Cited

U.S. PATENT DOCUMENTS 6,876,104 B1 * 4/2005 Guo ................. H05K 1/167
307/10.1
2007/0115643 A1 * 5/2007 Chen ................. H01L 23/4006
361/719
(Continued)

FOREIGN PATENT DOCUMENTS

JP     2015-126095 A     7/2015

*Primary Examiner* — Muhammad S Islam
(74) *Attorney, Agent, or Firm* — McDermott Will & Emery LLP

(57) ABSTRACT

An electronic device is downsized while suppressing performance degradation of the electronic device. In the electronic device, a power module including a power transistor is arranged in a first region on a back surface of a through hole board having a plurality of through hole vias having different sizes while a pre-driver including a control circuit is arranged in a second region on a front surface of the board. In this case, in a plan view, the first region and the second region have an overlapping region. The power module and the pre-driver are electrically connected to each other via a through hole via. The plurality of through hole vias include a through hole via having a first size, a through hole via which is larger than the first size and in which a cable can be inserted, and a through hole via in which a conductive member is embedded.

14 Claims, 19 Drawing Sheets

(51) Int. Cl.
*H05K 1/11* (2006.01)
*H05K 1/02* (2006.01)
*H05K 7/14* (2006.01)
*H02H 9/02* (2006.01)
*H02K 7/14* (2006.01)
*H02M 7/00* (2006.01)
*H02P 6/08* (2016.01)
*H05K 3/34* (2006.01)
*H05K 3/42* (2006.01)
*H02H 7/08* (2006.01)

(52) U.S. Cl.
CPC ......... *H05K 1/0206* (2013.01); *H05K 3/3447* (2013.01); *H05K 3/429* (2013.01); *H05K 2201/10015* (2013.01); *H05K 2201/10166* (2013.01); *H05K 2201/10356* (2013.01); *H05K 2201/10522* (2013.01); *H05K 2201/10545* (2013.01); *H05K 2201/10628* (2013.01); *H05K 2201/10636* (2013.01)

(58) Field of Classification Search
CPC .......... H05K 2201/10356; H05K 2201/10628; H05K 2201/10636; H05K 7/1432
See application file for complete search history.

(56) References Cited

U.S. PATENT DOCUMENTS

| | | | |
|---|---|---|---|
| 2009/0002956 A1* | 1/2009 | Suwa | B60L 1/003 361/728 |
| 2010/0109052 A1* | 5/2010 | Nakajima | H01L 21/823425 257/197 |
| 2015/0187732 A1* | 7/2015 | Yoshimi | H01L 25/0655 257/713 |
| 2016/0043555 A1* | 2/2016 | Howell | G06F 1/263 307/23 |

* cited by examiner

CR(L1)

CR(L2)

PR1  CR1

PR2  CR2

ELECTRONIC DEVICE

CROSS-REFERENCE TO RELATED APPLICATION

The present application claims priority from Japanese Patent Application No. 2016-124388 filed on Jun. 23, 2016, the content of which is hereby incorporated by reference into this application.

TECHNICAL FIELD OF THE INVENTION

The present invention relates to an electronic device, and, for example, to a technique effectively applied to an electronic device in which a first semiconductor device including a power circuit that allows a load current to flow to a load and a second semiconductor device including a control circuit that controls this power circuit are mounted on one wiring board.

BACKGROUND OF THE INVENTION

Japanese Patent Application Laid-Open Publication No. 2015-126095 (Patent Document 1) describes an electronic control device in which a power system electronic component and a control system electronic component are mounted on one board.

SUMMARY OF THE INVENTION

For example, there is an electronic device in which a first semiconductor device including a power circuit that allows a load current to flow to a load and a second semiconductor device including a control circuit that controls switching in this power circuit are mounted on one board. In the electronic device configured as described above, downsizing of an external size has been developed in order to reduce the cost. However, since a large amount of heat is generated when a power circuit is operated, the heat generated by the power circuit is likely to be transmitted to the control circuit by the downsizing of the electronic device, and therefore, there is a concern about malfunction of the control circuit. Also, there is a concern about adverse effect of electrical noises generated in the power circuit on the control circuit. Therefore, in order to achieve the downsizing of the electronic device, it is necessary to make an improvement to suppress the adverse effect of the heat and the electrical noises generated from the power circuit. That is, it is desirable to achieve the downsizing of the electronic device while suppressing deterioration in the performance of the electronic device.

Other object and novel characteristics of the present invention will be apparent from the description of the present specification and the accompanying drawings.

In an electronic device according to an embodiment, a first semiconductor device including a power transistor is arranged in a first region on a back surface of a through hole board having a plurality of through hole vias having different sizes from each other, and a second semiconductor device including a control circuit is arranged in a second region on a front surface of the through hole board. In this case, in a plan view, the first region and the second region have an overlapping region. The first semiconductor device and the second semiconductor device are electrically connected to each other via a through hole via. Further, the plurality of through hole vias include a first through hole via having a first size, a second through hole via which is larger than the first size and in which a cable can be inserted, and a third through hole via in which a conductive member is embedded.

According to an embodiment, the downsizing of the electronic device can be achieved while suppressing deterioration in the performance of the electronic device.

BRIEF DESCRIPTIONS OF THE DRAWINGS

DESCRIPTIONS OF THE PREFERRED EMBODIMENTS

Figure 1:
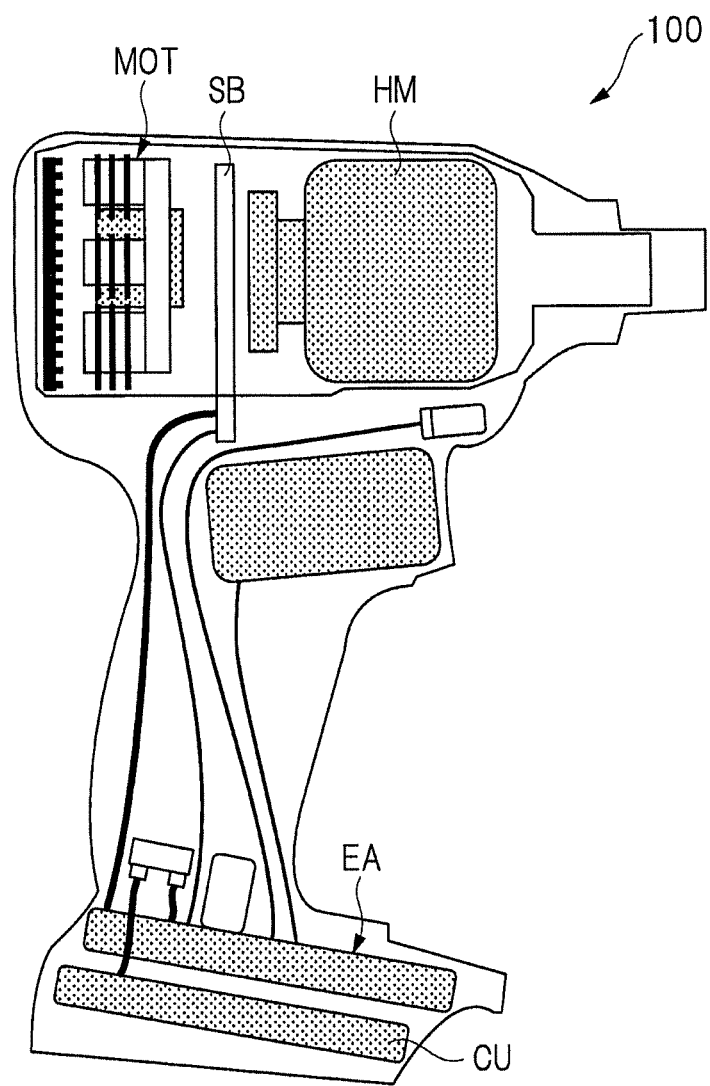
FIG. 1 is a diagram showing a schematic configuration of an electric impact driver to which an electronic device according to an embodiment is applied.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Also, the same components are denoted by the same reference symbols throughout the drawings for describing the embodiments, and the repetitive description thereof is omitted. Note that hatching is used even in a plan view so as to make the drawings easy to see.

Explanation for Terms

In the present specification, an "electronic component" means a component using electronics, and more particularly, a component using electronics in a semiconductor is a "semiconductor component". As an example of this "semiconductor component", a semiconductor chip can be cited. Therefore, a word including the "semiconductor chip" is the "semiconductor component", and a generic concept of the "semiconductor component" is the "electronic component".

In the present specification, the "semiconductor device" is a structure including a semiconductor component and an external connection terminal electrically connected to the semiconductor component, and means, for example, a structure having a semiconductor component covered with a sealing body. Particularly, the "semiconductor device" is configured to be able to be electrically connected to an external device by an external connection terminal.

Further, in the present specification, a "power transistor" is a collectivity of unit transistors in which a function of a unit transistor is achieved even in a current larger than an allowable current of the unit transistor by connecting a plurality of unit transistors (cell transistors) in parallel (for example, connecting several thousand to several hundred-thousand unit transistors in parallel). For example, when a unit transistor functions as a switching device, the "power transistor" becomes a switching device applicable to a current larger than the allowable current of the unit transistor. Particularly, in the present specification, a term "power transistor" is used as a word indicating a generic concept including, for example, both a "power MOSFET" and an "IGBT".

<Configuration of Electric Impact Driver>

The electronic device according to the present embodiment is an electronic device including a constituent element of an inverter that controls a load such as a motor. Therefore, the electronic device according to the present embodiment can be widely applied to products including a load such as motor. For example, as the products to which the electronic device according to the present embodiment can be applied, robots, drones (unmanned aircrafts), electric tools, and others can be cited. Particularly, in the present embodiment, as a specific example, explanation will be made while exemplifying a case of application of the electronic device according to the present embodiment to an electric tool.

FIG. 1 is a diagram showing a schematic configuration of an electric impact driver 100 to which the electronic device according to the present embodiment is applied. In FIG. 1, an electric impact driver 100 has a hammer HM provided inside a housing, a sensor board SB arranged on a back surface side of the hammer HM, and a motor MOT arranged on a back surface side of the sensor board SB. The electric impact driver 100 further has an electronic device EA electrically connected to the sensor board SB and a battery pack connecting portion CU electrically connected to the electronic device EA. The electric impact driver 100 according to the present embodiment is configured to be connectable to a battery pack that supplies electric power for operating the electric impact driver 100. More specifically, the electric impact driver 100 is configured so that a battery pack can be externally attached to the battery pack connecting portion CU shown in FIG. 1. As a result, the electric power can be supplied from the battery pack to the electric impact driver 100. Particularly, the drive of the motor MOT is controlled by the electronic device EA according to the present embodiment.

In the electric impact driver 100 configured as described above, the motor MOT and the hammer HM are connected via a gear. Therefore, by driving the motor MOT, the hammer HM can be rotated via the gear. With the rotation of the hammer HM, a bit attached to the electric impact driver 100 can be rotated, and an impact force can be applied in a rotation direction of the bit. As a result, by the electric impact driver 100, an impact force can be applied in the rotation direction of the bit in comparison with an electric drill driver which only rotates the bit, so that the electric impact driver 100 can strongly tighten a screw with the bit.

Figure 2:
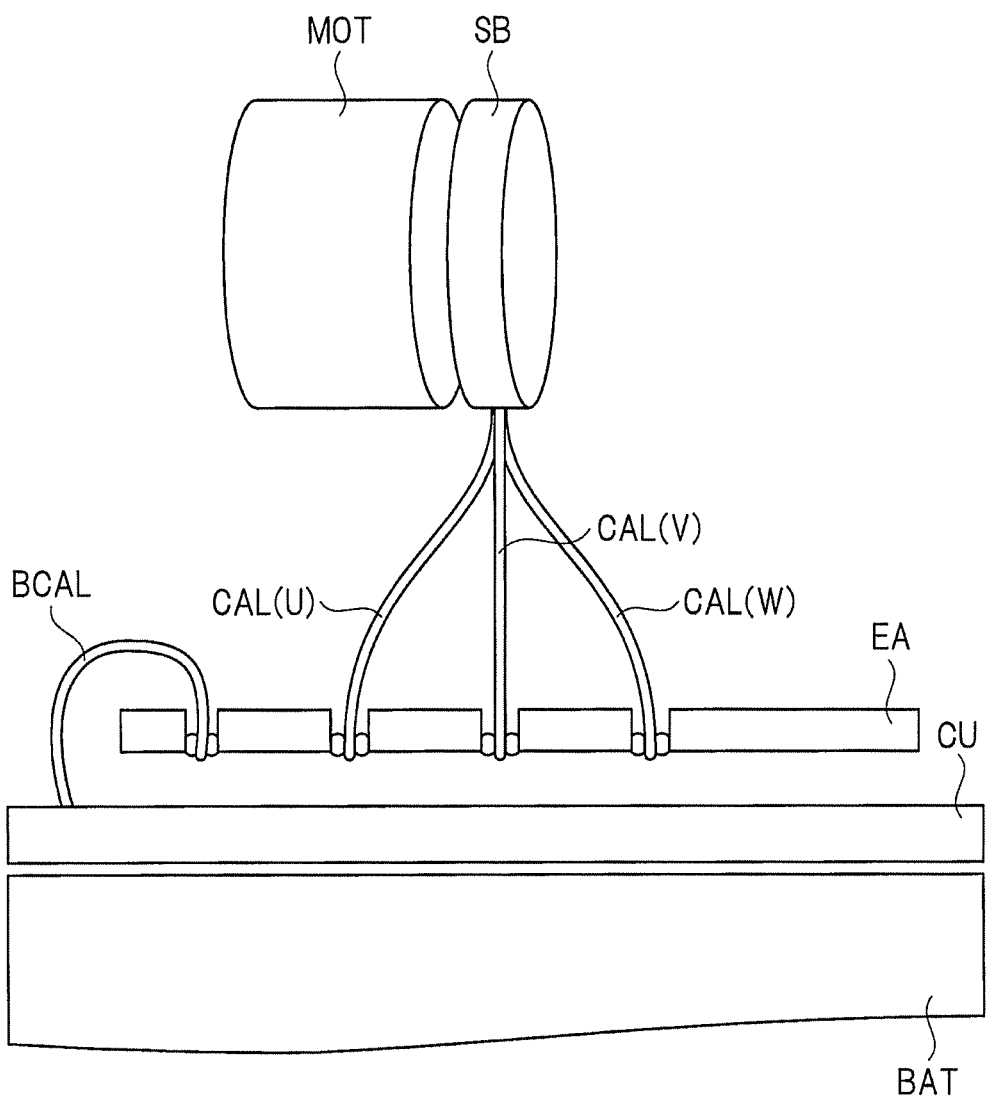
FIG. 2 is a diagram schematically showing an electrical connection configuration between an electronic device and a motor.

FIG. 2 is a diagram schematically showing the electrical connection configuration between the electronic device EA and the motor MOT. As shown in FIG. 2, in the present embodiment, a sensor board SB is provided close to the motor MOT. The sensor board SB and the electronic device EA are electrically connected to each other, and the electronic device EA is configured to control the motor MOT via the sensor board SB.

In this case, in the present embodiment, the motor MOT is constituted by a three-phase motor. Therefore, the electronic device EA and the sensor board SB are electrically connected to each other by a cable CAL(U), a cable CAL(V), and a cable CAL(W) respectively corresponding to three phases (U phase, V phase, W phase) of the three-phase motor. As shown in FIG. 2, the electronic device EA is electrically connected to the battery pack connecting portion CU by a power supply cable BCAL. The battery pack connecting portion CU is electrically connected to the battery pack BAT. Therefore, the power is supplied from the battery pack BAT to the electronic device EA via the battery pack connecting portion CU and the power supply cable BCAL.

<Circuit Block Configuration of Inverter>

Figure 3:
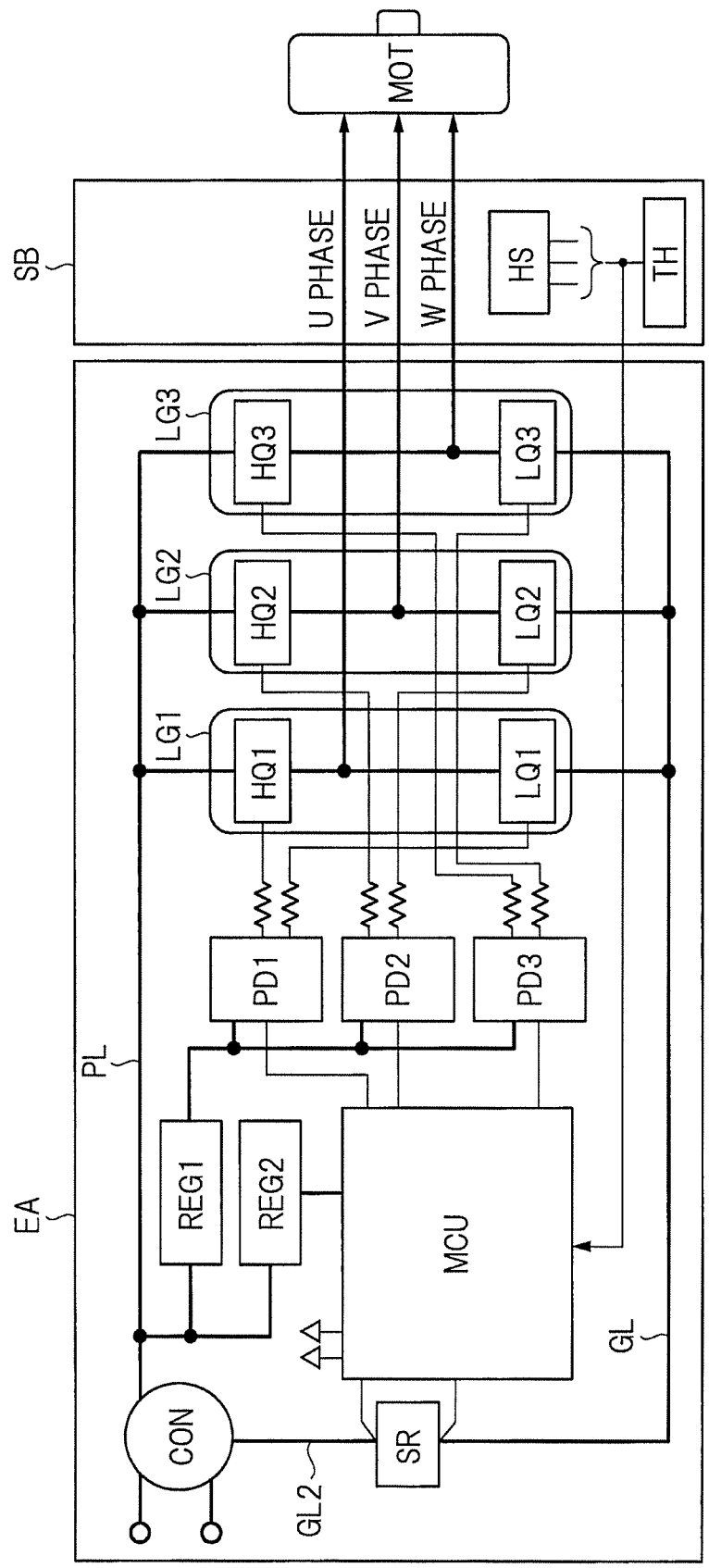
FIG. 3 is a schematic diagram showing a circuit block configuration of an inverter according to the embodiment.

Subsequently, a circuit block configuration of the inverter controlling the motor MOT will be described. FIG. 3 is a schematic diagram showing the circuit block configuration of the inverter according to the present embodiment. As shown in FIG. 3, the inverter which controls the motor MOT is constituted by constituent elements provided in the sensor board SB and constituent elements provided in the electronic device EA.

First, the constituent elements provided in the electronic device EA will be described. The electronic device EA includes, for example, a power supply line PL in which a power supply potential of 18 V is supplied from the battery pack (battery) BAT as shown in FIG. 2, a ground line GL2 in which a reference potential (GND potential) of 0 V is supplied from the battery pack BAT, and a ground line GL which is electrically connected to the ground line GL2 via a shunt resistance element SR used to detect an overcurrent.

The electronic device EA has a function of supplying a load current to the motor MOT which is a load. This electronic device EA has a power circuit through which the load current flows and a control circuit for controlling the power circuit.

More specifically, in FIG. 3, the power circuit has a leg LG1 corresponding to the U-phase, a leg LG2 corresponding to the V-phase, and a leg LG3 corresponding to the W-phase. Particularly, the leg LG1 corresponding to the U-phase is constituted by a high-side power transistor HQ1 constituting an upper arm and a low-side power transistor LQ1 constituting a lower arm. Similarly, the leg LG2 corresponding to the V-phase is constituted by a high-side power transistor HQ2 configuring an upper arm and a low-side power transistor LQ2 configuring a lower arm. Further, the leg LG3 corresponding to the W-phase is constituted by a high-side power transistor HQ3 configuring an upper arm and a low-side power transistor LQ3 configuring a lower arm.

In this case, in the leg LG1 corresponding to the U-phase, a drain terminal of the high-side power transistor HQ1 (a terminal to which a power supply potential which is a fixed potential is supplied) is electrically connected to the power supply line PL. Furthermore, a source terminal of the high-side power transistor HQ1 (a terminal electrically connectable to a load) and a drain terminal of the low-side power transistor LQ1 (a terminal electrically connectable to a load) are electrically connected to each other. This connection node is electrically connected to the U-phase of the motor MOT. A source terminal of the low-side power transistor LQ1 (a terminal to which a reference potential (GND potential) which is a fixed potential is supplied) is electrically connected to the ground line GL.

Similarly, in the leg LG2 corresponding to the V-phase, a drain terminal of the high-side power transistor HQ2 (a terminal to which a power supply potential which is a fixed potential is supplied) is electrically connected to the power supply line PL. Furthermore, a source terminal of the high-side power transistor HQ2 (a terminal electrically connectable to a load) and a drain terminal of the low-side power transistor LQ2 (a terminal electrically connectable to a load) are electrically connected to each other. This connection node is electrically connected to the V-phase of the motor MOT. A source terminal of the low-side power transistor LQ2 (a terminal to which a reference potential (GND potential) which is a fixed potential is supplied) is electrically connected to the ground line GL.

Also, in the leg LG3 corresponding to the W-phase, a drain terminal of the high-side power transistor HQ3 (a terminal to which a power supply potential which is a fixed potential is supplied) is electrically connected to the power supply line PL. Furthermore, a source terminal of the high-side power transistor HQ3 (a terminal electrically connectable to a load) and a drain terminal of the low-side power transistor LQ3 (a terminal electrically connectable to a load) are electrically connected to each other. This connection node is electrically connected to the W-phase of the motor MOT. A source terminal of the low-side power transistor LQ3 (a terminal to which a reference potential (GND potential) which is a fixed potential is supplied) is electrically connected to the ground line GL.

Further, in FIG. 3, a load current flows from the power supply line PL to the motor MOT which is the load via the high-side power transistors HQ1 to HQ3, and then, flows from the motor MOT to the ground line GL via the low-side power transistors LQ1 to LQ3. Then, the load current flows to the ground line GL2 via the shunt resistance element SR. Therefore, the power circuit through which the load current flows also includes the shunt resistance element SR in addition to the high-side power transistors HQ1 to HQ3, the low-side power transistors LQ1 to LQ3.

Subsequently, in FIG. 3, the control circuit includes a microprocessor MCU and pre-drivers PD1 to PD3. The microprocessor MCU is electrically connected to each of the pre-drivers PD1 to PD3, and is configured to control each of the pre-drivers PD1 to PD3. Based on the control by this microprocessor MCU, each of the pre-drivers PD1 to PD3 performs the switching operation of the power circuit.

More specifically, the pre-driver PD1 has a function of controlling the switching of each of the high-side power transistor HQ1 and the low-side power transistor LQ1. Similarly, the pre-driver PD2 has a function of controlling the switching of each of the high-side power transistor HQ2 and the low-side power transistor LQ2. Furthermore, the pre-driver PD3 has a function of controlling the switching of each of the high-side power transistor HQ3 and the low-side power transistor LQ3.

In this case, each of the high-side power transistors HQ1 to HQ3 and the low-side power transistors LQ1 to LQ3 can be constituted by a "power MOSFET" or an "IGBT". In this case, each of the high-side power transistors HQ1 to HQ3 and the low-side power transistors LQ1 to LQ3 has a gate electrode. Therefore, by changing the gate voltage applied to the gate electrode, the pre-drivers PD1 to PD3 can control the switching operations (ON/OFF operations) of the high-side power transistors HQ1 to HQ3 and the low-side power transistors LQ1 to LQ3, respectively.

The microprocessor MCU is configured to monitor the voltage at both ends of the shunt resistance element SR. For example, the microprocessor MCU detects an overcurrent, which is caused to flow from the ground line GL to the ground line GL2 by a short circuit of the power circuit or others, by monitoring the voltage drop at both ends of the shunt resistance element SR. More specifically, when the voltage drop between the both ends of the shunt resistance element SR exceeds a predetermined threshold value, the microprocessor MCU is configured to determine that the overcurrent occurs to protect the power circuit.

Note that each of the pre-drivers PD1 to PD3 constituting the control circuit is electrically connected to a regulator REG1. This regulator REG1 is configured to generate a voltage of 18 V to 15 V supplied from the power supply line PL. A voltage of 15 V generated by the regulator REG1 is supplied to each of pre-drivers PD1 to PD3. Meanwhile, the microprocessor MCU constituting the control circuit is electrically connected to a regulator REG2. This regulator REG2 is configured to generate a voltage of 18 V to 5 V supplied from the power supply line PL. A voltage of 5 V generated by the regulator REG2 is supplied to the microprocessor MCU.

Subsequently, the constituent elements provided in the sensor board SB will be explained. For example, as shown in FIG. 3, the sensor board SB is provided with a Hall sensor HS and a thermistor TH. The Hall sensor HS has the function of detecting an angle of a rotor which is a constituent element of motor MOT. On the other hand, the thermistor TH has a function of detecting a temperature in vicinity of the motor MOT. Each of the Hall sensor HS and the thermistor TH is electrically connected to the microprocessor MCU provided in the electronic device EA. The microprocessor MCU controls the pre-drivers PD1 to PD3 based on the output signal from the Hall sensor HS and the output signal from the thermistor TH. As a result, the switching control of the power circuit based on the output signals of the Hall sensor HS and the thermistor TH is achieved by the pre-drivers PD1 to PD3. The motor MOT can be driven so as to reflect the output signals of the Hall sensor HS and the thermistor TH.

In the inverter in the present embodiment, the power supply voltage to be used (the voltage supplied from the battery) is assumed to be relatively low, and therefore, each of the high-side power transistors HQ1 to HQ3 and the low-side power transistors LQ1 to LQ3 constituting the power circuit can be constituted by a "power MOSFET". More specifically, when the "power MOSFET" is used as the switching device of the inverter, a freewheel diode connected in antiparallel to the power MOSFET is unnecessary. This is because the device structure of the power MOSFET has a body diode constituted by a p-n junction diode between an epitaxial layer (drift layer, n-type semiconductor region) and a body region (p-type semiconductor region), this body diode having a function as the freewheel diode.

However, the technical idea in the present embodiment is not limited to a case in which the power transistor constituting the power circuit is made of the "power MOSFET", and the power transistor constituting the power circuit can also be constituted by, for example, an "IGBT". In this case, it is necessary to provide a freewheel diode in anti-parallel to the "IGBT". For example, a case in which the load driven by the inverter includes an inductance as the motor MOT has a mode in which a load current (reflux current) flows in a direction opposite to the switching device that is turned ON. More specifically, when the inductance is included in the load, energy returns from the inductance of the load to the inverter (power circuit) (i.e., a current flows backward) in some cases. However, since the "IGBT" alone has no function to allow this reflux current to flow, it is necessary to connect the freewheel diode in anti-parallel to the "IGBT". More specifically, in the inverter, when the load includes the inductance as similar to the motor MOT, it is necessary to discharge the energy stored in the inductance when the IGBT is turned OFF. However, the IGBT alone does not allow the reflux current to flow for releasing the energy stored in the inductance. Therefore, in order to allow the electric energy stored in this inductance to return, a freewheel diode is connected in anti-parallel to the "IGBT". More specifically, the freewheel diode has a function of allowing the reflux current to flow for releasing the electric energy stored in the inductance. Therefore, when the "IGBT" is used as the switching device of the power circuit, it is necessary to provide a freewheel diode in anti-parallel to the "IGBT".

<Mounting Configuration of Electronic Device>

Figure 4:
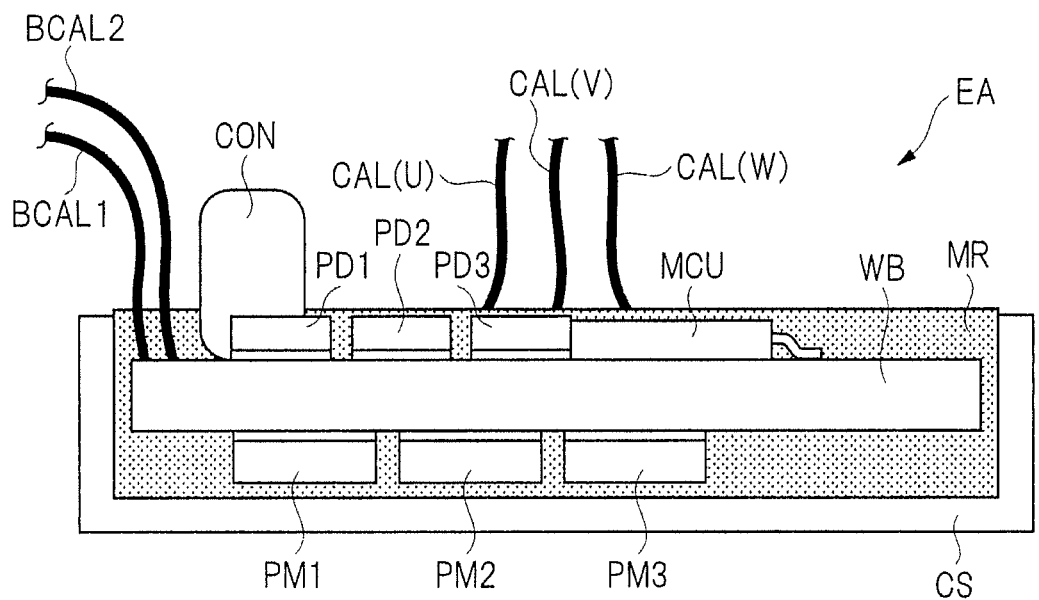
FIG. 4 is a diagram showing a schematic mounting configuration of the electronic device according to the embodiment.

Subsequently, the mounting configuration of the electronic device EA which is a constituent element of the inverter will be explained. FIG. 4 is a diagram showing a schematic mounting configuration of the electronic device EA according to the present embodiment. In FIG. 4, the electronic device EA according to the present embodiment has a through hole board WB arranged in a case CS. On the front surface (the upper surface) of the through hole board WB, for example, the microprocessor MCU and the pre-drivers PD1 to PD3 constituting the control circuit of the inverter are mounted, and besides, a capacitor (electrolytic capacitor) CON is also mounted. On the other hand, on the back surface (the lower surface) of the through hole board WB, for example, the power modules PM1 to PM3 constituting the power circuit of the inverter are mounted. Cables CAL(U), CAL(V), CAL(W) are connected to the through hole board WB, and these cables CAL(U), CAL(V), CAL(W) are led from the front surface side of the through hole board WE to the outside. Similarly, power supply cables BCAL1 and BCAL2 are also connected to the through hole board WB, and these power supply cables BCAL1 and BCAL2 are also led from the front surface side of the through hole board WB to the outside.

As described above, the electronic components are mounted on both the front and back surfaces of the through hole board WB constituting the electronic device EA. The through hole board WB on which the electronic components are mounted is disposed inside the case CS and is sealed by a sealing body MR made of, for example, resin. As described above, the electronic device EA according to the present embodiment is mounted and configured.

Figure 5:
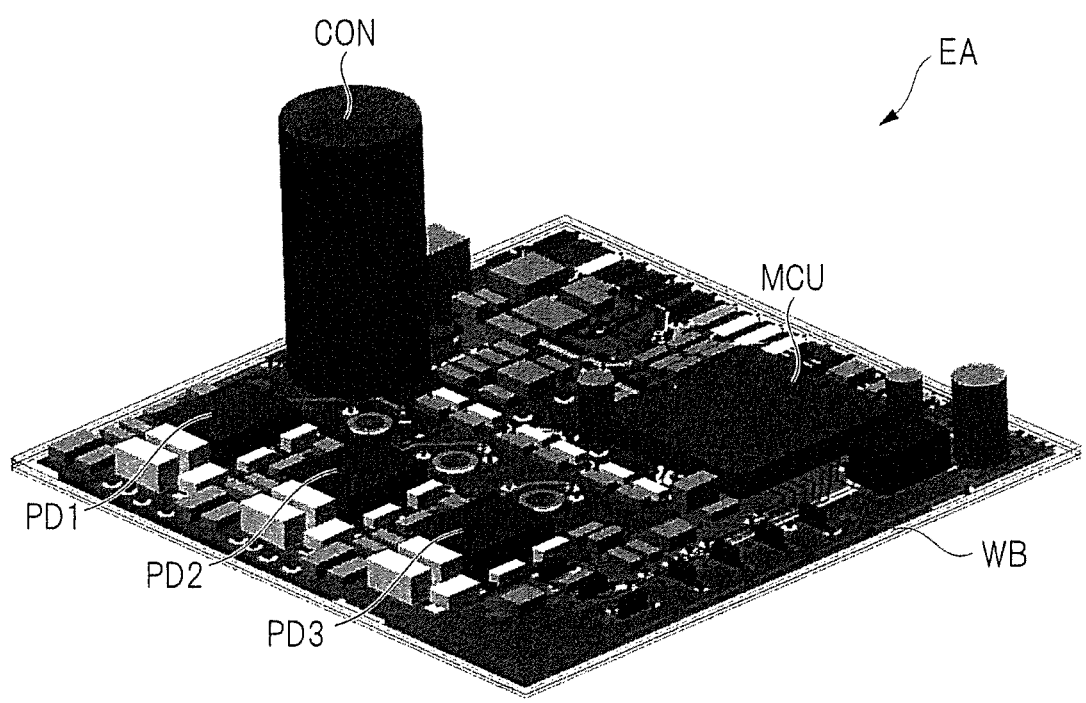
FIG. 5 is a perspective view of the electronic device according to the embodiment which is viewed from a front surface side of a through hole board.

FIG. 5 is a perspective view of the electronic device EA according to the present embodiment which is viewed from the front surface side of the through hole board WB. As shown in FIG. 5, on the front surface of the through hole board WB, a plurality of electronic components constituting the control circuit of the inverter are mounted. For example, on the front surface of the through hole board WB, the microprocessor MCU and the pre-drivers PD1 to PD3 are mounted as semiconductor devices (semiconductor packages), and besides, a capacitor CON made of an electrolytic capacitor is mounted.

Figure 6:
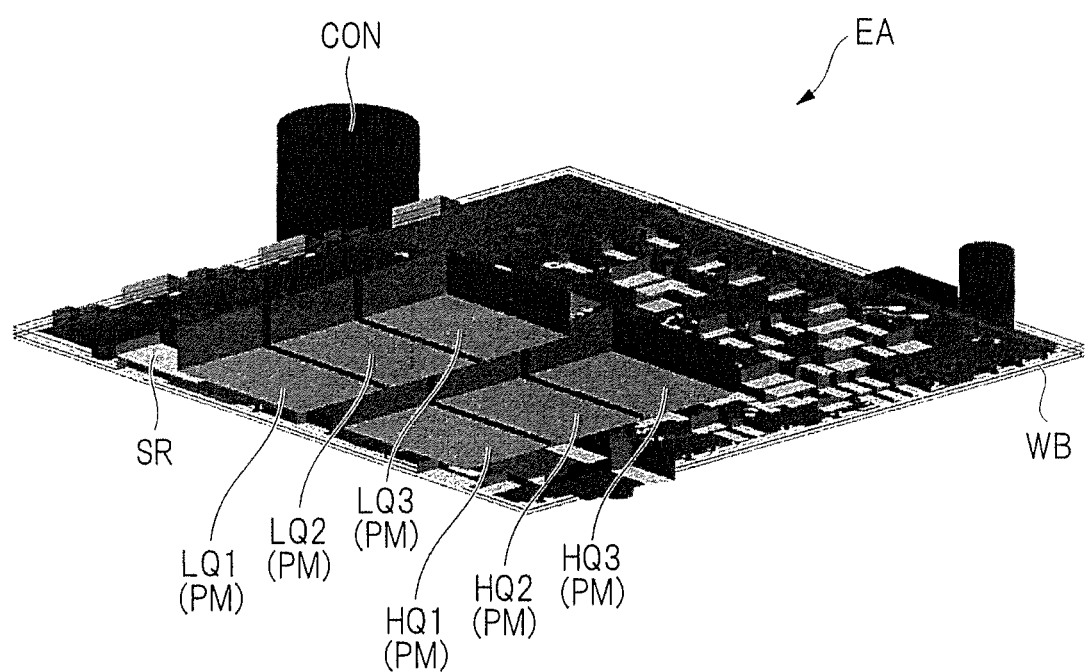
FIG. 6 is a perspective view illustrating the electronic device according to the embodiment which is viewed from a back surface side of the through hole board.

On the other hand, FIG. 6 is a perspective view of the electronic device EA according to the present embodiment which is viewed from the back surface side of the through hole board WB. As shown in FIG. 6, on the back surface of the through hole board WB, a plurality of electronic components constituting the power circuit of the inverter and electronic components constituting the control circuit of the inverter are mounted. For example, the electronic components constituting the power circuit of the inverter are six power modules PM in the form of the semiconductor device (semiconductor package). Inside of each of these six power modules PM, a power transistor which is the switching device of the power circuit is formed. More specifically, three high-side power transistors HQ1 to HQ3 and three low-side power transistors LQ1 to LQ3 are mounted as the six power modules PM on the back surface of the through hole board WB. Further, the shunt resistance element SR serving as an electronic component constituting the power circuit of the inverter is also mounted on the back surface of the through hole board WB.

<Through Hole Board According to Embodiment>

Figure 7:
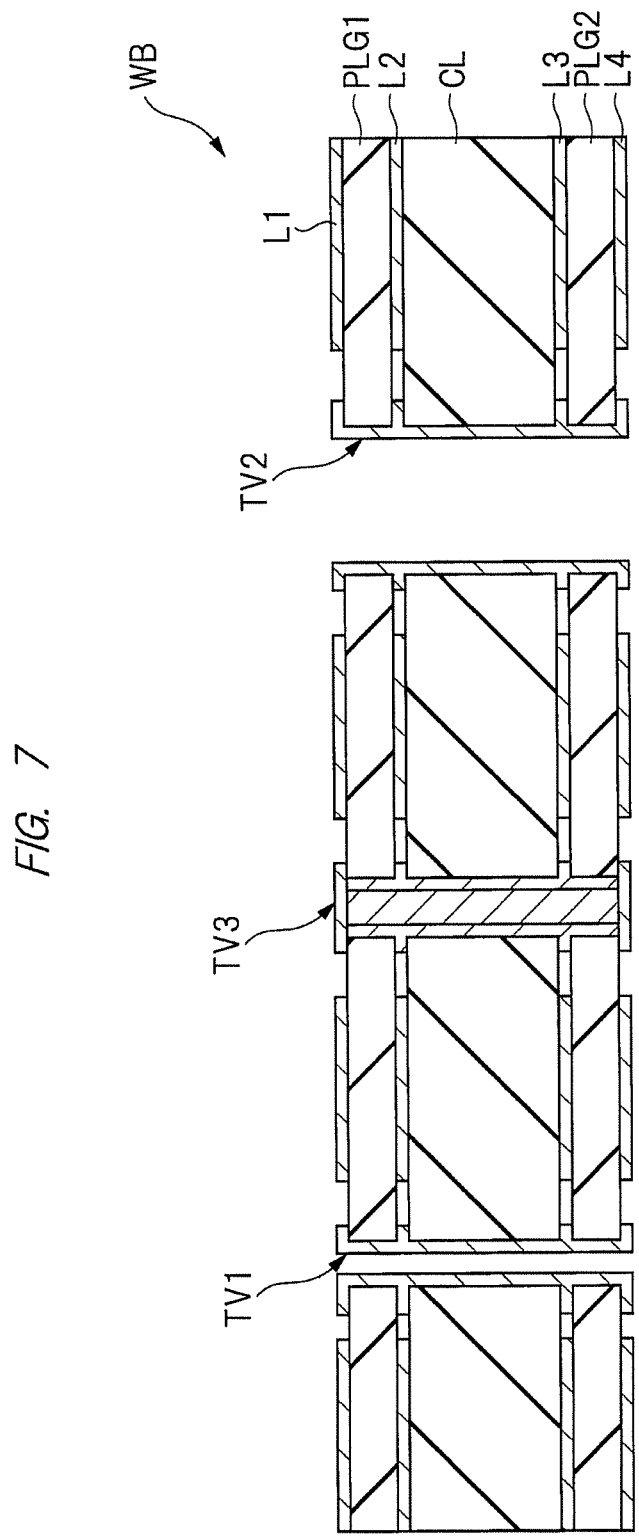
FIG. 7 is a diagram schematically showing a basic configuration of the through hole board according to the embodiment.

Subsequently, the through hole board WB according to the present embodiment will be explained. FIG. 7 is a diagram schematically showing the basic configuration of the through hole board WB according to the present embodiment. As shown in FIG. 7, the through hole board WB according to the present embodiment includes a prepreg layer PLG1, a core layer CL arranged in a lower layer of the prepreg layer PLG1, a prepreg layer PLG2 arranged in a lower layer of the core layer CL. In other words, it can be said that the through hole board WB according to the present embodiment includes the prepreg layer PLG1, the prepreg layer PLG2, the core layer CL sandwiched between the prepreg layer PLG1 and the prepreg layer PLG2. In this case, in the through hole board WB according to the present embodiment, the thickness of the core layer CL is larger than the thickness of the prepreg layer PLG1 and the thickness of the prepreg layer PLG2. As shown in FIG. 7, the through hole board WB according to the present embodiment includes a wiring layer L1 formed on the upper surface of the prepreg layer PLG1, a wiring layer L2 famed on the upper surface of the core layer CL, a wiring layer L3 formed on the lower surface of the core layer CL, and a wiring layer L4 formed on the lower surface of the prepreg layer PLG2.

Further, the through hole board WB according to the present embodiment includes a plurality of "through hole vias". The term "through hole via" as referred to herein means a via having a structure that penetrates through the prepreg layer PLG1, the core layer CL, and the prepreg layer PLG2. In the through hole board WB according to the present embodiment, only the "through hole via" is formed as the via. In other words, the through hole board WB according to the present embodiment has only the "through hole vias" reaching the back surface of the through hole board WB from the front surface of the through hole board WB. More specifically, in understandable expression using the wiring layers (L1 to L4) as shown in FIG. 7, in the through hole board WB according to the present embodiment, for example, a "blind via" connecting only between the wiring layer L1 and the wiring layer L2 in FIG. 7 and a "blind via" connecting between the wiring layer L3 and the wiring layer L4 in FIG. 7 are not formed. Similarly, in the through hole board WE according to the present embodiment, for example, a "buried via" connecting only between the wiring layer L2 and the wiring layer L3 which are internal wiring layers is not formed. Each of the "blind via" and the "buried via" has a structure that is so called an "IVH (interstitial via hole)". Particularly, a multi-layer board having a "blind via" and a "buried via" is called a buildup board and an "HDI (High Density Interconnect)". Therefore, the through hole board WB according to the present embodiment is clearly distinguished from the buildup board having so-called "blind vias" and "buried vias" because it does not have the "blind via" and the "buried via".

The through hole board WB according to the present embodiment configured as described above is advantageous in that the cost of the board can be reduced as compared with the buildup board having "blind via" and "buried via" formed by using laser processing or others because it has only the "through hole via" formed by drilling. More specifically, the cost of the through hole board WB according to the present embodiment can be suppressed. Therefore, by the usage of the through hole board WB, it is expected to reduce the manufacturing cost of the entire electronic device.

Subsequently, the through hole board WB according to the present embodiment includes a plurality of through hole vias having different structures from one another. More specifically, for example, as shown in FIG. 7, the through hole board WB according to the present embodiment has a plurality of through hole vias (TV1, TV2, TV3) having different sizes (different diameters) from one another. For example, in the through hole board WB according to the present embodiment, the diameter of the through hole via TV1 is about 0.3 mm, the diameter of the through hole via TV2 is about 1.8 mm, and the diameter of the through hole via TV3 is about 0.5 mm. Further, among the plurality of through hole vias (TV1, TV2, TV3) formed in the through hole board WB according to the present embodiment, some through hole via TV3 have a conductive member embedded therein. More specifically, in the through hole board WB according to the present embodiment, the through hole vias (TV1, TV2) having a cavity therein and the through hole via TV3 having a conductive member embedded therein are mixed.

From the above description, the through hole board WB according to the present embodiment is defined as, for example, follows. More specifically, the through hole board WB according to the present embodiment is defined as a "board having only a plurality of through hole vias reaching the back surface from the front surface as vias, in which the through hole vias include through hole vias having different structures from one another." Further, in more detailed definition, the through hole board WB according to the present embodiment is defined as a "board having only a plurality of through hole vias reaching the back surface from the front surface as vias, in which the through hole vias include the through hole via (TV1) having a first size, the through hole via (TV2) whose size is larger than the first size and in which a cable can be inserted, and the through hole via (TV3) having a conductive member embedded therein."

<Interlayer Layout Configuration in Electronic Device (Through Hole Vias are Omitted)>

Figure 8:
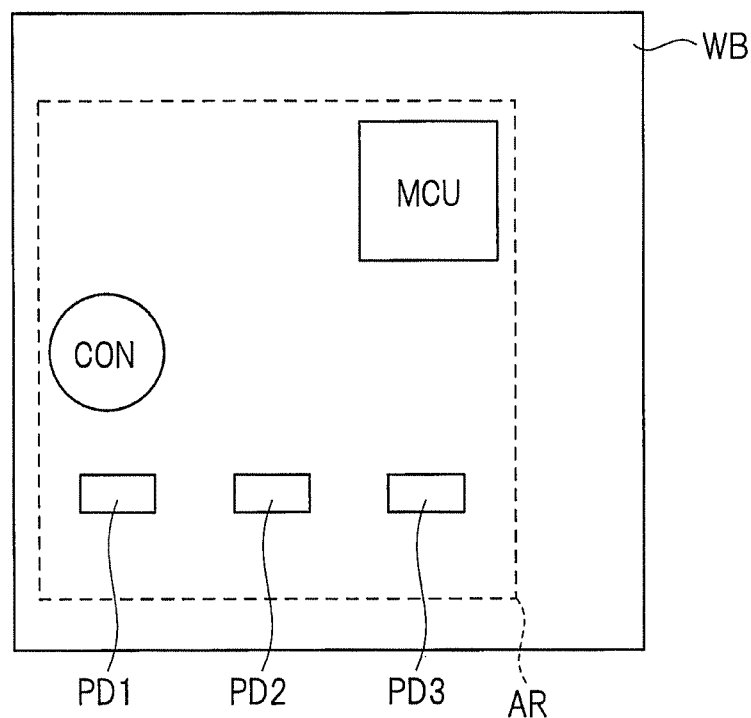
FIG. 8 is a plan view showing a layout of a front surface of the through hole board according to the embodiment.

Subsequently, a schematic interlayer layout configuration of an electronic device including the through hole board WB according to the present embodiment will be explained. First, FIG. 8 is a plan view showing the layout configuration of the front surface of the through hole board WB according to the present embodiment. As shown in FIG. 8, a planar shape of the through hole board WB according to the present embodiment is rectangular. On a region AR (second region) included in the front surface of the through hole board WB, the microprocessor MCU (semiconductor device), the pre-drivers PD1 to PD3 (semiconductor device), and the capacitor CON (electronic component) are mounted.

Although not shown in FIG. 8, note that a gate resistance element is also mounted on the region AR. More specifically, in the front surface of the through hole board WB, semiconductor devices which are constituent elements of the control circuit which controls the power transistors are arranged.

Although not shown, the wiring layer L1 is formed on the front surface of the through hole board WB (more specifically, the upper surface of the prepreg layer PLG1 as shown in FIG. 7), and this wiring layer L1 configures the control circuit wiring layer configuring the control circuit.

Figure 9:
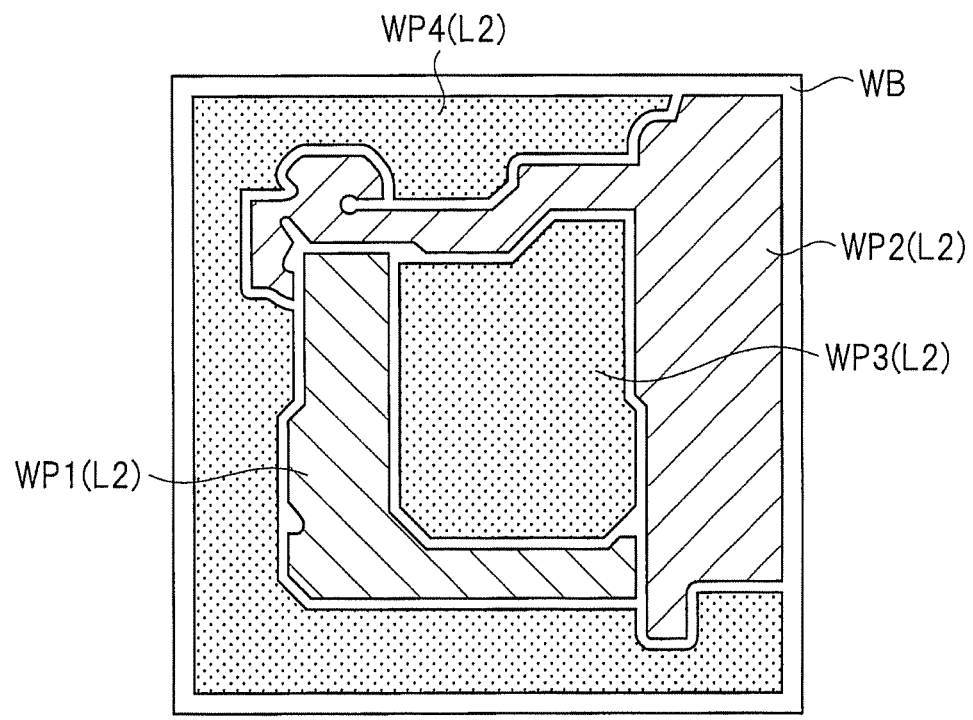
FIG. 9 is a plan view showing a layout pattern of a second wiring layer formed on an upper surface of a core layer shown in FIG. 7.

Subsequently, FIG. 9 is a plan view showing a layout pattern of the wiring layer L2 formed on the lower surface of the prepreg layer PLG1 (the upper surface of the core layer CL) shown in FIG. 7. In FIG. 9, the wiring layer L2 also configures the control circuit wiring layer which configures the control circuit. Note that FIG. 9 is a perspective view of the through hole board WB which is viewed from the front surface side.

More specifically, as shown in FIG. 9, the wiring layer L2 includes a wiring pattern WP1, a wiring pattern WP2, a wiring pattern WP3, and a wiring pattern WP4. In this case, for example, the wiring pattern WP1 is a wiring pattern to which a potential of 15 V stepped down from 18 V by the regulator REG1 as shown in FIG. 3 is applied, and the wiring pattern WP2 is a wiring pattern to which a potential of 5 V stepped down from 18 V by the regulator REG2 as shown in FIG. 3 is applied. On the other hand, the wiring pattern WP3 and the wiring pattern WP4 are wiring patterns to which a reference potential (GND potential) for the control circuit is applied.

Figure 10:
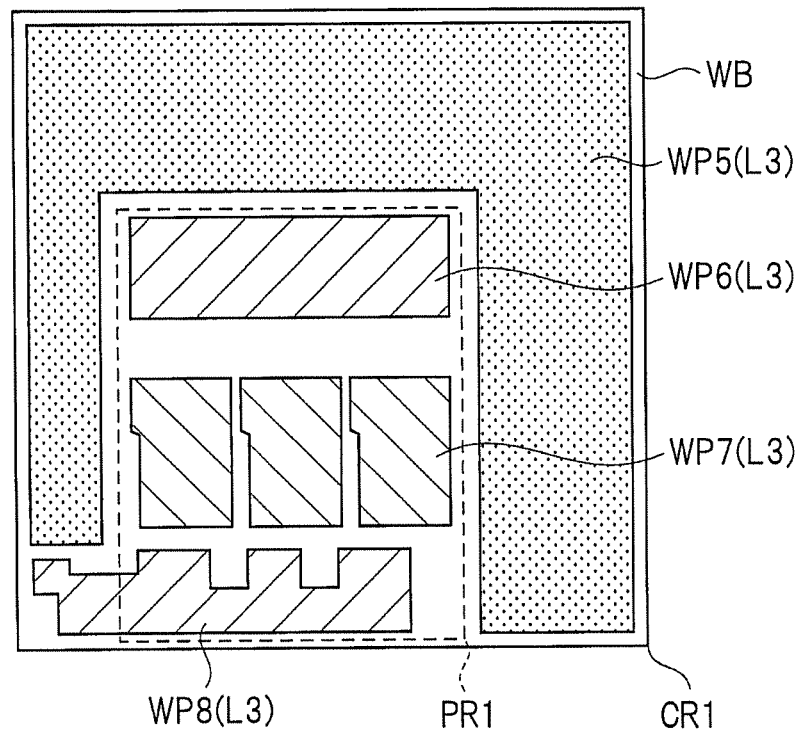
FIG. 10 is a plan view showing a layout pattern of a third wiring layer formed on a lower surface of a core layer shown in FIG. 7.

Further, FIG. 10 is a plan view showing the layout pattern of the wiring layer L3 formed on the lower surface of the core layer CL (the upper surface of the prepreg layer PLG2) shown in FIG. 7. In FIG. 10, the wiring layer L3 includes the wiring layer for the power circuit configuring the power circuit for supplying a current to the load (motor) and the wiring layer for the control circuit separated from the wiring layer for the power circuit. Note that FIG. 10 is a perspective view of the through hole board WB which is viewed from the front surface side.

More specifically, as shown in FIG. 10, the wiring layer L3 includes wiring patterns WP6, WP7 formed in the power circuit region PR1 overlapping the region AR (second region) as shown in FIG. 8 in a plan view, a wiring pattern WP5 formed in the control circuit region CR1 spaced apart from the power circuit forming region PR1, and a wiring pattern WP8 formed to extend over the power circuit region PR1 and the control circuit region CR1. In this case, the wiring pattern WP5 formed in the control circuit region CR1 is a wiring pattern to which the reference potential (GND potential) for the control circuit is applied.

Figure 11:
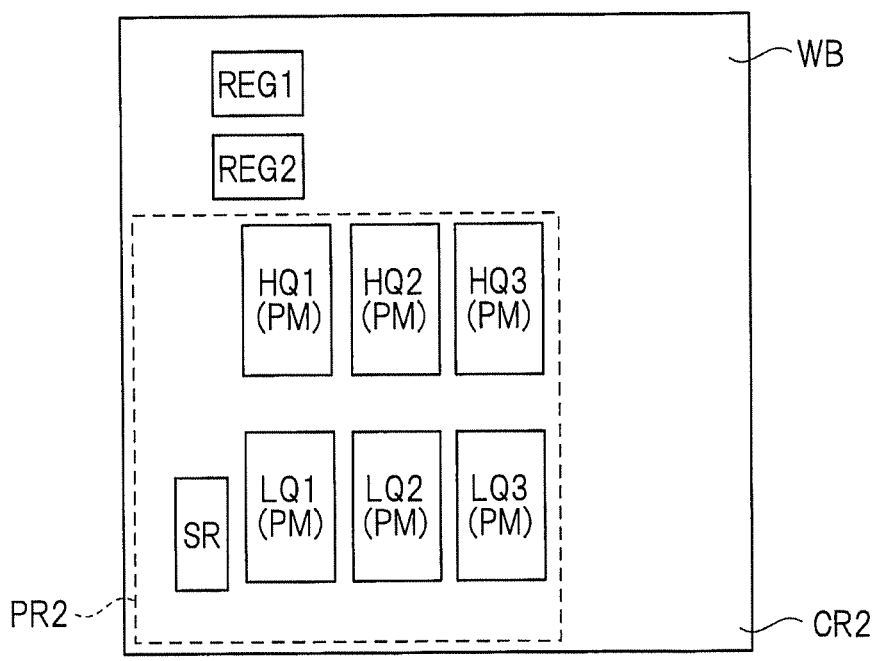
FIG. 11 is a plan view showing a layout of a back surface of the through hole board according to the embodiment.

Subsequently, FIG. 11 is a plan view showing a layout configuration of the back surface of the through hole board WB according to the present embodiment. Note that FIG. 11 is a perspective view of the through hole board WB which is viewed from the front surface side.

As shown in FIG. 11, a planar shape of the through hole board WB according to the present embodiment is rectangular. Three power modules PM (semiconductor devices) corresponding to the respective high-side power transistors HQ1 to HQ3, three power modules PM (semiconductor devices) corresponding to the respective low-side power transistors LQ1 to LQ3, and the shunt resistance element SR (electronic component) are arranged in the power circuit region PR2 (second region) included in the back surface of the through hole board WB. On the other hand, the regulators REG1, REG2 are arranged in the control circuit region CR2 which is spaced apart from the power circuit forming region PR2. More specifically, in the back surface of the through hole board WB, semiconductor devices which are constituent elements of the power circuit including the power transistor and semiconductor devices which are constituent elements of the control circuit which controls the power transistor are arranged. Although not shown, note that the wiring layer L4 is formed on the back surface of the through hole board WB (more specifically, the lower surface of the prepreg layer PLG2 shown in FIG. 7). The wiring layer L4 is configured to include the wiring layer for the power circuit configuring the power circuit and the wiring layer for the control circuit separated from the wiring layer for the power circuit.

As seen from FIGS. 10 and 11, the power circuit region PR1 of the wiring layer L3 shown in FIG. 10 and the power circuit region PR2 of the wiring layer L4 shown in FIG. 11 have a region overlapping in a plan view, and the power circuit region PR1 of the wiring layer L3 and the power circuit region PR2 of the wiring layer L4 are connected to each other by the through hole via TV3 although not shown in FIG. 10 and FIG. 11.

<Layout Configuration of Power Circuit Region>

Figure 12:
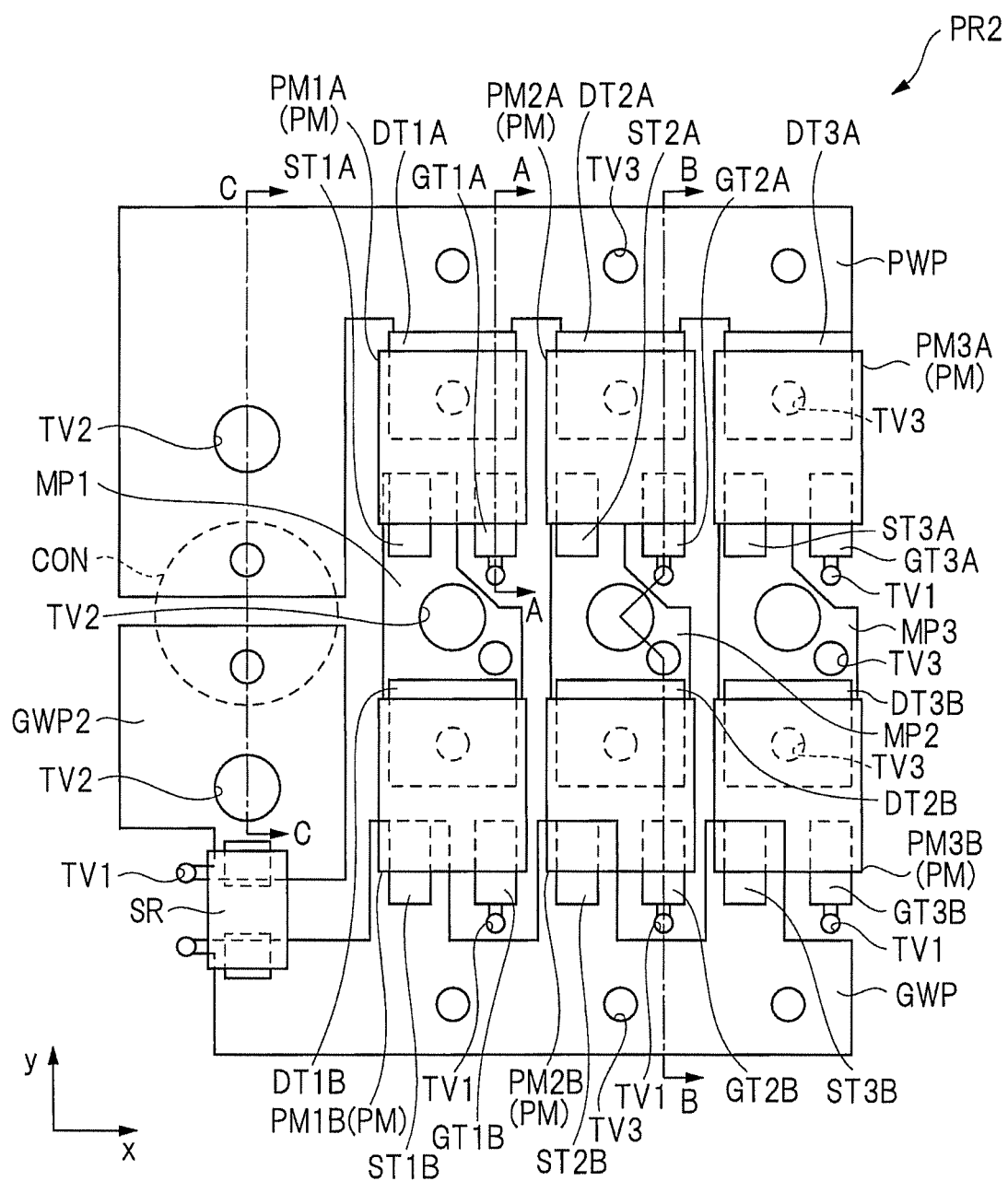
FIG. 12 is a plan view showing a layout of a power circuit region according to the embodiment.

Subsequently, the layout configuration of the power circuit region PR2 shown in FIG. 11 will be described. FIG. 12 is a plan view showing the layout configuration of the power circuit region PR2 according to the present embodiment. Note that FIG. 12 is a perspective view of the through hole board WB which is viewed from the front surface side.

In FIG. 12, a power supply wiring pattern PWP extending in the x direction and a ground wiring pattern GWP extending in the x direction so as to be spaced apart from the power supply wiring pattern PWP are formed in the power circuit region PR2. As shown in FIG. 12, the power supply wiring pattern PWP has a "protruding unit" protruding in the y direction at the left end portion, and a ground wiring pattern GWP2 (conductive pattern) is formed in the y direction so as to be opposed to and spaced apart from this power supply wiring pattern PWP. Furthermore, this ground wiring pattern GWP2 is electrically connected to the ground wiring pattern GWP extending in the x direction via the shunt resistance element SR for detecting the overcurrent.

The power supply wiring pattern PWP configured as described above is connected to a plurality of through hole vias TV3 and is connected to the through hole via TV2 at the "protruding unit" of the power supply wiring pattern PWP. The power supply wiring pattern PWP is configured to be electrically connected to the positive electrode (power supply potential supply source) of the battery (power storage device) by the through hole via TV2 connected to the "protruding unit".

Meanwhile, the ground wiring pattern GWP is also connected to a plurality of through hole vias TV3. The ground wiring pattern GWP2 electrically connected to this ground wiring pattern GWP is connected to the through hole via TV2 via the shunt resistance element SR. The ground wiring pattern GWP2 is configured to be electrically connected to the negative electrode (GND potential supply source) of the battery (power storage device) by this through hole via TV2.

Further, for example, the capacitor CON having the positive electrode terminal and the negative electrode terminal is mounted on the front surface of the through hole board WB (see FIG. 8) opposite to the back surface of the through hole board WB (see FIG. 11) in which the power circuit region PR2 is formed. In this case, as shown in FIG. 12, the positive electrode terminal of the capacitor CON is connected to the power supply wiring pattern PWP formed on the back surface of the through hole board WB so as to penetrate the through hole board WB. On the other hand, the negative electrode terminal of the capacitor CON is connected to the ground wiring pattern GWP2 formed on the back surface of the through hole board WB so as to penetrate the through hole board WB.

Subsequently, as shown in FIG. 12, in the y direction intersecting with the x direction, conductive patterns MP1 to MP3 arranged side by side in the x direction are formed at a position sandwiched between the power supply wiring pattern PWP and the ground wiring pattern GWP. In this case, as shown in FIG. 12, a through hole via TV2 and a through hole via TV3 are connected to each of the conductive patterns MP1 to MP3 arranged side by side in the x direction. As a result, each of the conductive patterns MP1 to MP3 is configured to be electrically connected to the load (motor) via the through hole via TV2.

For example, the conductive pattern MP1 can be electrically connected to the U-phase of the motor (load) via the through hole via TV2 connected to the conductive pattern MP1. Similarly, the conductive pattern MP2 can be electrically connected to the V-phase of the motor (load) via the through hole via TV2 connected to the conductive pattern MP2. And, the conductive pattern MP3 can be electrically connected to the W-phase of the motor (load) via the through hole via TV2 connected to the conductive pattern MP3.

Further, the through hole via TV1 is provided at a position close to but spaced apart from each of the conductive patterns MP1 to MP3. More specifically, as shown in FIG. 12, the through hole via TV1 is provided so as to correspond to each of the conductive patterns MP1 to MP3. The through hole vias TV1 provided so as to correspond to each of the conductive patterns MP1 to MP3 are arranged side by side in the x direction.

Subsequently, as shown in FIG. 12, a high-side power module PM1A is provided at a position sandwiched in the y direction between the power supply wiring pattern PWP and the through hole via TV2 connected to the conductive pattern MP1. Similarly, a high-side power module PM2A is provided at a position sandwiched in the y direction between the power supply wiring pattern PWP and the through hole via TV2 connected to the conductive pattern MP2. A high-side power module PM3A is provided at a position sandwiched in the y direction between the power supply wiring pattern PWP and the through hole via TV2 connected to the conductive pattern MP3. Further, as shown in FIG. 12, a low-side power module PM1B is provided at a position sandwiched in the y direction between the through hole via TV2 connected to the conductive pattern MP1 and the ground wiring pattern GWP. Similarly, a low-side power module PM2B is provided at a position sandwiched in the y direction between the through hole via TV2 connected to the conductive pattern MP2 and the ground wiring pattern GWP. A low-side power module PM3B is provided at a position sandwiched in the y direction between the through hole via TV2 connected to the conductive pattern MP3 and the ground wiring pattern GWP. As shown in FIG. 12, the through hole via TV1 (on the left side in the x direction) is provided at a position close to the low-side power module PM1B, the through hole via TV1 (at the center in the x direction) is provided at a position close to the low-side power module PM2B, and the through hole via TV1 (on the right side in the x direction) is provided at a position close to the low-side power module PM3B.

As described above, the power circuit region PR2 according to the present embodiment is provided with three high-side power modules PM1A to PM3A and three low-side power modules PM1B to PM3B. In this case, six power modules PM which are combination of the three high-side power modules PM1A to PM3A and the three low-side power modules PM1B to PM3B have the same structure as one another. More specifically, the power circuit region PR2 according to the present embodiment is configured to be provided with the six power modules PM.

In this case, each of the six power modules PM includes a "control terminal", a "first terminal" electrically connectable to the load, and a "second terminal" to which a fixed potential is supplied.

More specifically, as shown in FIG. 12, the high-side power module PM1A includes a gate terminal GT1A as a "control terminal", a source terminal ST1A as a "first terminal" electrically connectable to the load, and a drain terminal DT1A as a "second terminal" to which the power supply potential (fixed potential) is supplied. In this case, as shown in FIG. 12, the gate terminal GT1A of the high-side power module PM1A is electrically connected to the through hole via TV1 close to the conductive pattern MP1. The source terminal ST1A of the high-side power module PM1A is electrically connected to the conductive pattern MP1. As a result, the source terminal ST1A of the high-side power module PM1A is electrically connected to the through hole via TV2 connected to the conductive pattern MP1. Therefore, the source terminal ST1A of the high-side power module PM1A is configured to be electrically connectable to the load (U-phase). Further, the drain terminal DT1A of the high-side power module PM1A is connected to the power supply wiring pattern PWP.

The high-side power module PM2A includes a gate terminal GT2A as a "control terminal", a source terminal ST2A as a "first terminal" electrically connectable to the load, and a drain terminal DT2A as a "second terminal" to which the power supply potential (fixed potential) is supplied. In this case, as shown in FIG. 12, the gate terminal GT2A of the high-side power module PM2A is electrically connected to the through hole via TV1 close to the conductive pattern MP2. The source terminal ST2A of the high-side power module PM2A is electrically connected to the conductive pattern MP2. As a result, the source terminal ST2A of the high-side power module PM2A is electrically connected to the through hole via TV2 connected to the conductive pattern MP2. Therefore, the source terminal ST2A of the high-side power module PM2A is configured to be electrically connectable to the load (V-phase). Further, the drain terminal DT2A of the high-side power module PM2A is connected to the power supply wiring pattern PWP.

The high-side power module PM3A includes a gate terminal GT3A as a "control terminal", a source terminal ST3A as a "first terminal" electrically connectable to the load, and a drain terminal DT3A as a "second terminal" to which the power supply potential (fixed potential) is supplied. In this case, as shown in FIG. 12, the gate terminal GT3A of the high-side power module PM3A is electrically connected to the through hole via TV1 close to the conductive pattern MP3. The source terminal ST3A of the high-side power module PM3A is electrically connected to the conductive pattern MP3. As a result, the source terminal ST3A of the high-side power module PM3A is electrically connected to the through hole via TV2 connected to the conductive pattern MP3. Therefore, the source terminal ST13A of the high-side power module PM3A is configured to be electrically connectable to the load (W-phase). Further, the drain terminal DT3A of the high-side power module PM3A is connected to the power supply wiring pattern PWP.

As shown in FIG. 12, the low-side power module PM1B includes a gate terminal GT1B as a "control terminal", a drain terminal DT1B as a "first terminal" electrically connectable to the load, and a source terminal ST1B as a "second terminal" to which the ground potential (fixed potential) is supplied. In this case, as shown in FIG. 12, the gate terminal GT1B of the low-side power module PM1B is electrically connected to the through hole via TV1 (on the left side in the x direction). The drain terminal DT1B of the low-side power module PM1B is electrically connected to the conductive pattern MP1. As a result, the drain terminal DT1B of the low-side power module PM1B is electrically connected to the through hole via TV2 connected to the conductive pattern MP1. Therefore, the drain terminal DT1B of the low-side power module PM1B is configured to be electrically connectable to the load (U-phase). Further, the source terminal ST1B of the low-side power module PM1B is connected to the ground wiring pattern GWP.

The low-side power module PM2B includes a gate terminal GT2B as a "control terminal", a drain terminal DT2B as a "first terminal" electrically connectable to the load, and a source terminal ST2B as a "second terminal" to which the ground potential (fixed potential) is supplied. In this case, as shown in FIG. 12, the gate terminal GT2B of the low-side power module PM2B is electrically connected to the through hole via TV1 (at the center in the x direction). The drain terminal DT2B of the low-side power module PM2B is electrically connected to the conductive pattern MP2. As a result, the drain terminal DT2B of the low-side power module PM2B is electrically connected to the through hole via TV2 connected to the conductive pattern MP2. Therefore, the drain terminal DT2B of the low-side power module PM2B is configured to be electrically connectable to the load (V-phase). Further, the source terminal ST2B of the low-side power module PM2B is connected to the ground wiring pattern GWP.

The low-side power module PM3B includes a gate terminal GT3B as a "control terminal", a drain terminal DT3B as a "first terminal" electrically connectable to the load, and a source terminal ST3B as a "second terminal" to which the ground potential (fixed potential) is supplied. In this case, as shown in FIG. 12, the gate terminal GT3B of the low-side power module PM3B is electrically connected to the through hole via TV1 (on the right side in the x direction). The drain terminal DT3B of the low-side power module PM3B is electrically connected to the conductive pattern MP3. As a result, the drain terminal DT3B of the low-side power module PM3B is electrically connected to the through hole via TV2 connected to the conductive pattern MP3. Therefore, the drain terminal DT3B of the low-side power module PM3B is configured to be electrically connectable to the load (W-phase). Further, the source terminal ST3B of the low-side power module PM3B is connected to the ground wiring pattern GWP.

<Structure of Through Hole Via TV1>

Figure 13:
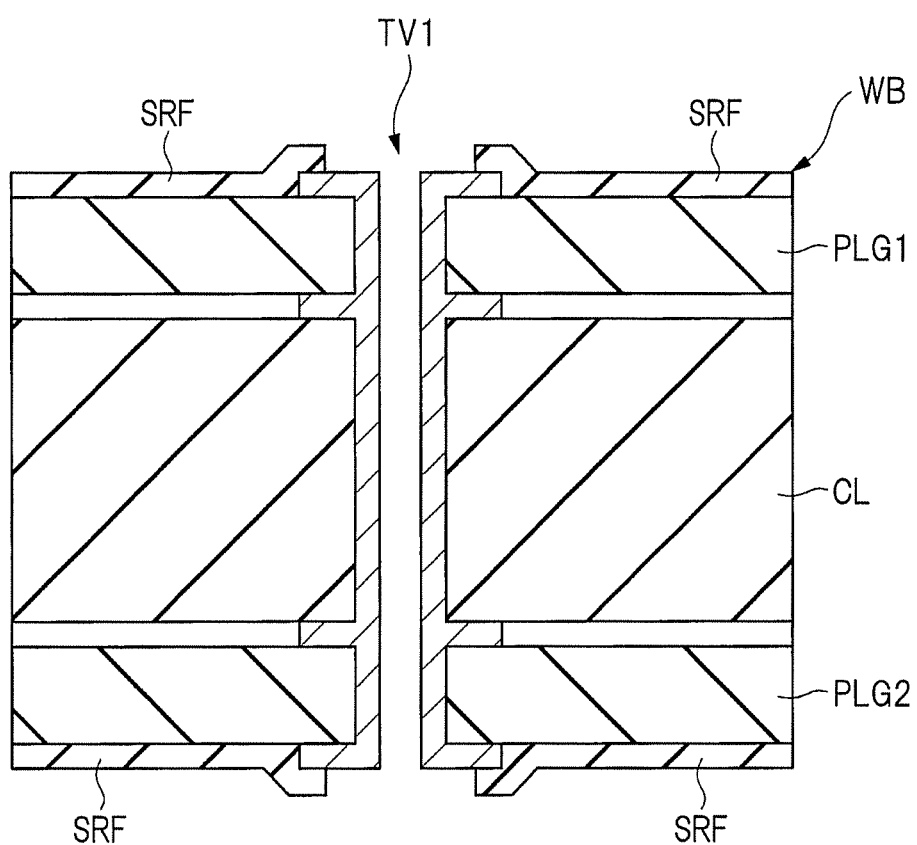
FIG. 13 is a diagram showing a schematic cross-sectional structure of a through hole via formed in a through hold board according to the embodiment.

Subsequently, a cross-sectional structure of the through hole via TV1 will be described. FIG. 13 is a diagram showing a schematic cross-sectional structure of the through hole via TV1 formed in the through hole board WB according to the present embodiment. In FIG. 13, the through hole via TV1 penetrates through the prepreg layer PLG1, the core layer CL, and the prepreg layer PLG2, which configure the through hole board WB. In other words, it can be said that the through hole via TV1 according to the present embodiment is formed from the front surface (upper surface) of the through hole board WB to reach the back surface (lower surface) of the through hole board WB. As shown in FIG. 13, the through hole via TV1 has a conductive film (plating film) formed continuously over the front surface of the through hole board WB, the inner wall of the through hole via TV1, and the back surface of the through hole board WB. On both of the front surface and the back surface of the through hole board WB, the ends of the conductive film are covered with a solder resist film SRF.

Further, inside of the through hole via TV1 has such a cavity as reaching both the front surface of the through hole board WB and the back surface of the through hole board WB. The through hole via TV1 configured as described above is formed by, for example, drilling, and a diameter of through hole via TV1 is, for example, about 0.3 mm.

<Structure of Through Hole Via TV2>

Figure 14:
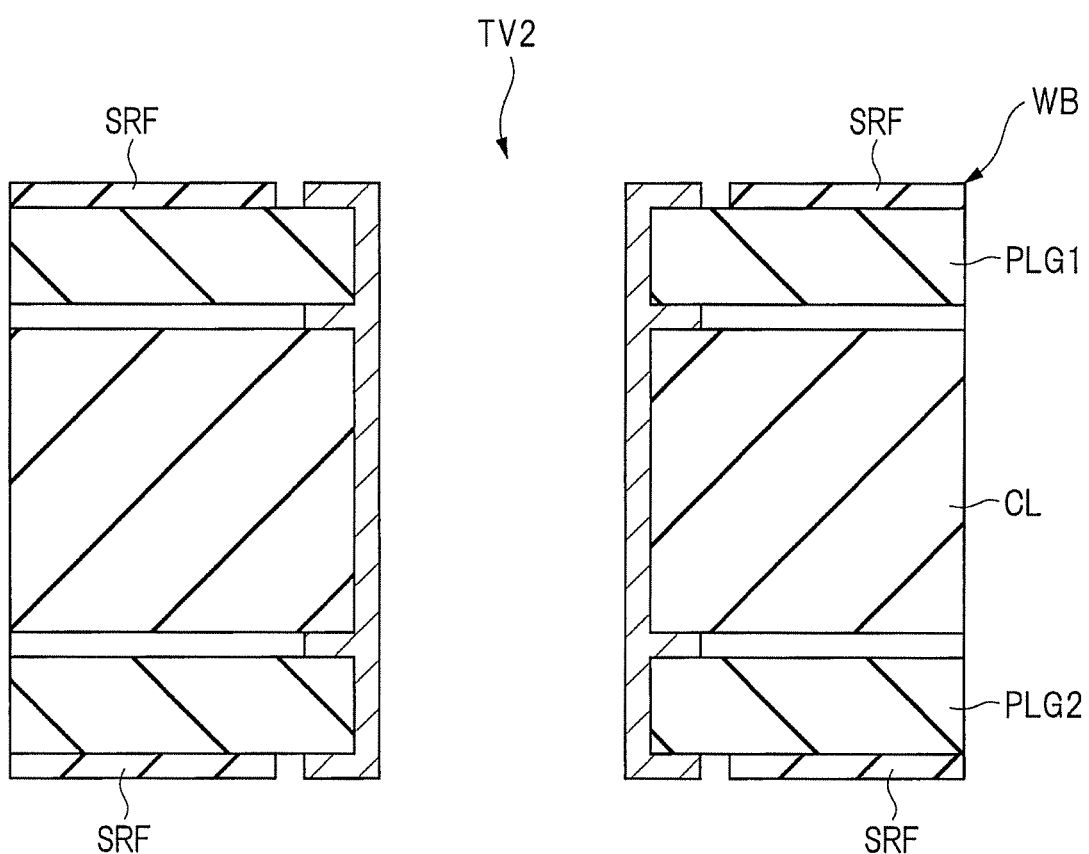
FIG. 14 is a diagram showing a schematic cross-sectional structure of a through hole via formed in a through hold board according to the embodiment.

Subsequently, a cross-sectional structure of the through hole via TV2 will be described. FIG. 14 is a diagram showing a schematic cross-sectional structure of the through hole via TV2 formed in the through hole board WB according to the present embodiment. In FIG. 14, the through hole via TV2 penetrates through the prepreg layer PLG1, the core layer CL, and the prepreg layer PLG2, which configure the through hole board WB. In other words, as similar to the through hole via TV1, it can be said that the through hole via TV2 according to the present embodiment is also formed from the front surface (upper surface) of the through hole board WB to reach the back surface (lower surface) of the through hole board WB. As shown in FIG. 14, the through hole via TV2 has a conductive film (plating film) formed continuously over the front surface of the through hole board WB, the inner wall of the through hole via TV2, and the back surface of the through hole board WB. However, as different from the through hole via TV1 shown in FIG. 13, on both of the front surface and the back surface of the through hole board WB, the ends of the conductive film are exposed from the solder resist film SRF. On the other hand, also in the through hole via TV2, as similar to the through hole via TV1, inside of the through hole via TV2 has such a cavity as reaching both the front surface of the through hole board WB and the back surface of the through hole board WB.

The through hole via TV2 configured as described above is also formed by, for example, drilling, and a diameter of through hole via TV2 is, for example, about 0.8 mm. That is, a size (diameter) of the through hole via TV2 is larger than a size (diameter) of the through hole via TV1, and particularly, the through hole via TV2 is formed to have a size that is large enough to allow a cable to be inserted therein.

<Structure of Through Hole Via TV3>

Figure 15:
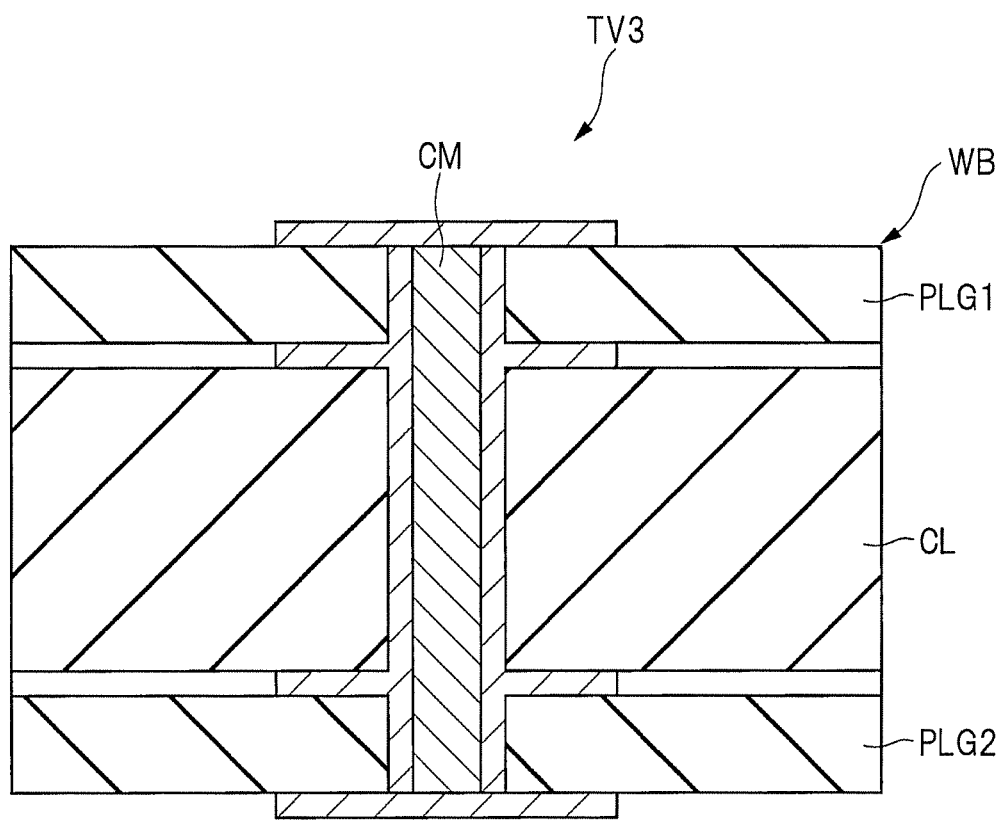
FIG. 15 is a diagram showing a schematic cross-sectional structure of a through hole via formed in a through hold board according to the embodiment.

Further, a cross-sectional structure of the through hole via TV3 will be described. FIG. 15 is a diagram showing a schematic cross-sectional structure of the through hole via TV3 formed in the through hole board WB according to the present embodiment. In FIG. 15, the through hole via TV3 penetrates through the prepreg layer PLG1, the core layer CL, and the prepreg layer PLG2, which configure the through hole board WB. In other words, as similar to the through hole via TV1 and the through hole via TV2, it can be said that the through hole via TV3 according to the present embodiment is also formed from the front surface (upper surface) of the through hole board WB to reach the back surface (lower surface) of the through hole board WE. The through hole via TV3 has a conductive film (plating film) formed continuously over the front surface of the through hole board WB, the inner wall of the through hole via TV3, and the back surface of the through hole board WB.

As shown in FIG. 15, inside of this through hole via TV3 has a conductive member CM filled therein to have a favorable thermal conductivity. As a result, a cavity is not formed in the through hole via TV3, so that it can be said that the through hole via TV3 has a thermal conductivity higher than those of the through hole via TV1 and the through hole via TV2 each having a structure in which the cavity is formed.

The through hole via TV3 configured as described above is also formed by, for example, drilling, and a diameter of through hole via TV3 is, for example, about 0.5 mm. The through hole via TV3 can be formed by filling, for example, a paste-form conductive resin inside the through hole formed by the drilling.

<Cross-Sectional Structure of Electronic Device>

Figure 16:
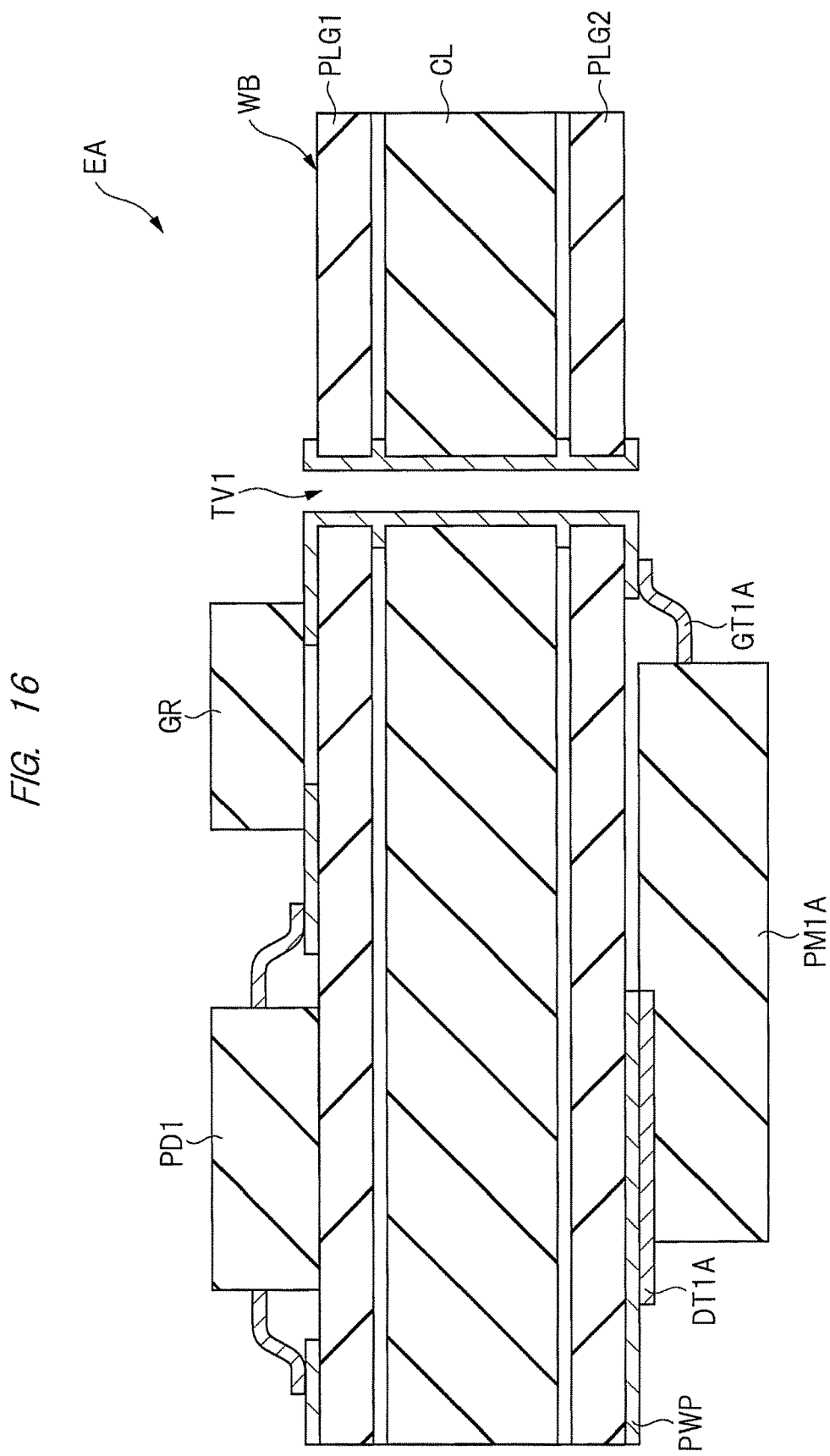
FIG. 16 is a cross-sectional view cut along a line A-A in FIG. 12.

Subsequently, a cross-sectional structure of the electronic device EA according to the present embodiment will be described. FIG. 16 is a cross-sectional view taken along a line A-A of FIG. 12. As shown in FIG. 16, the high-side power module PM1A is provided on the back surface of the through hole board WB. The drain terminal DT1A of the high-side power module PM1A is connected to the power supply wiring pattern PWP which is formed on the back surface (lower surface) of the through hole board WB. In the through hole board WB, the through hole via TV1 that penetrates through the through hole board WB is formed. The gate terminal GT1A of this high-side power module PM1A is connected to this through hole via TV1.

On the other hand, on the front surface (upper surface) of the through hole board WB, the gate resistance element GR and the pre-driver PD1 are mounted. In this case, in the electronic device EA according to the present embodiment as shown in FIG. 16, the gate terminal GT1A of the high-side power module PM1A provided on the back surface of the through hole board WB is electrically connected via the through hole via TV1 to the gate resistance element GR mounted on the front surface of the through hole board WB. The gate resistance element GR is electrically connected to the pre-driver PD1 by a wiring pattern formed on the front surface of the through hole board WB.

Figure 17:
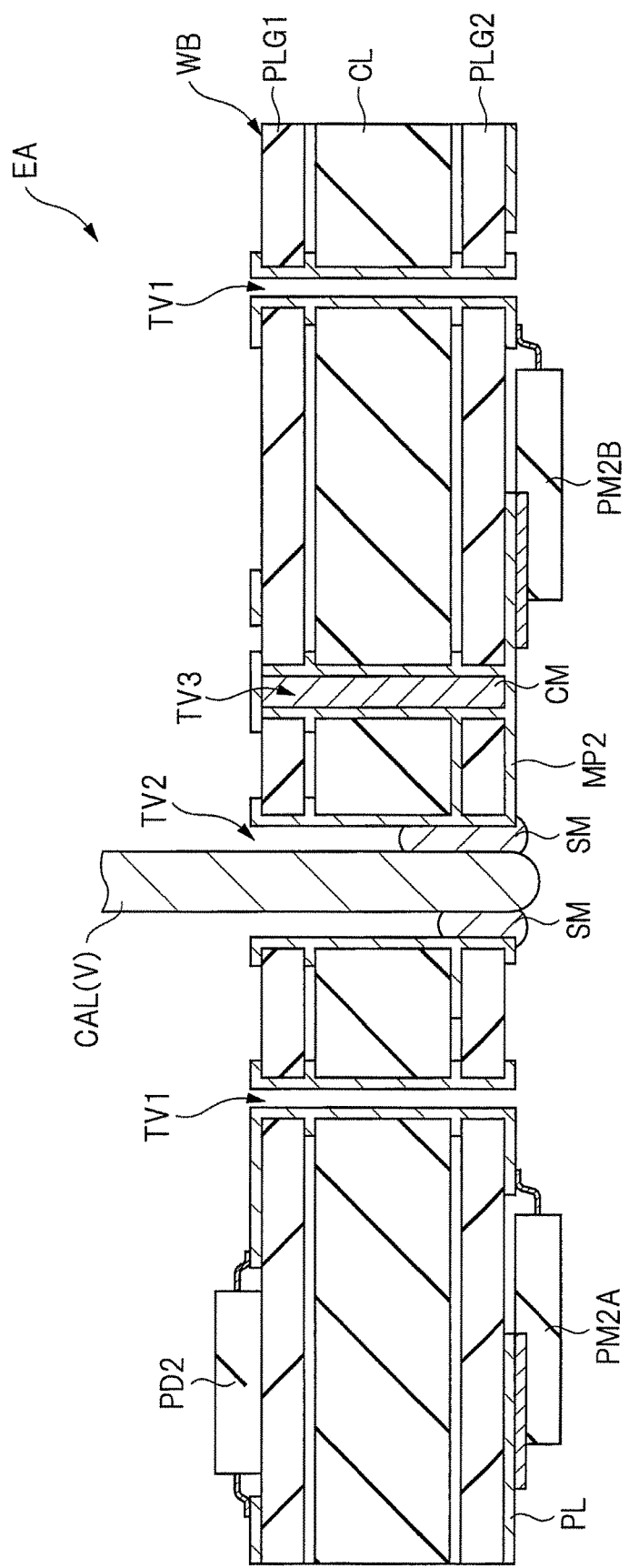
FIG. 17 is a cross-sectional view cut along a line B-B in FIG. 12.

Subsequently, FIG. 17 is a cross-sectional view taken along a line B-B of FIG. 12. As shown in FIG. 17, in the through hole board WB, through hole vias TV1, TV2, TV3 whose types are different from one another and which penetrate through the through hole board WB are formed. More specifically, in the through hole board WB, the through hole via TV1 having a first size, the through hole via TV2 whose size is larger than the first size, and the through hole via TV3 filled with the conductive member CM therein are formed.

As shown in FIG. 17, the high-side power module PM2A provided on the back surface of the through hole board WB is electrically connected to a gate resistance element (not shown) and the pre-driver PD2 via the through hole via TV1. Note that the low-side power module PM2B provided on the back surface of the through hole board WB is also electrically connected to the pre-driver PD2 via the different through hole via TV1.

On the other hand, as shown in FIG. 17, in the through hole via TV2, a cable CAL(V) which is connectable to the load (motor) is inserted. On the back surface of the through hole board WB, the cable CAL(V) inserted in the through hole via TV2 is soldered to the through hole board WB with a solder material SM.

Therefore, in the present embodiment, the front surface of the through hole board WB is defined as the surface into which the cable CAL(V) is inserted, and the back surface of the through hole board WB is defined as the surface to which the cable CAL(V) is soldered.

Further, in FIG. 17, the through hole via TV3 is provided at a position overlapping the power circuit region (power circuit region PR2 in FIG. 11) on which the high-side power module PM2A and the low-side power module PM2B are mounted in the back surface of the through hole board WB.

Figure 18:
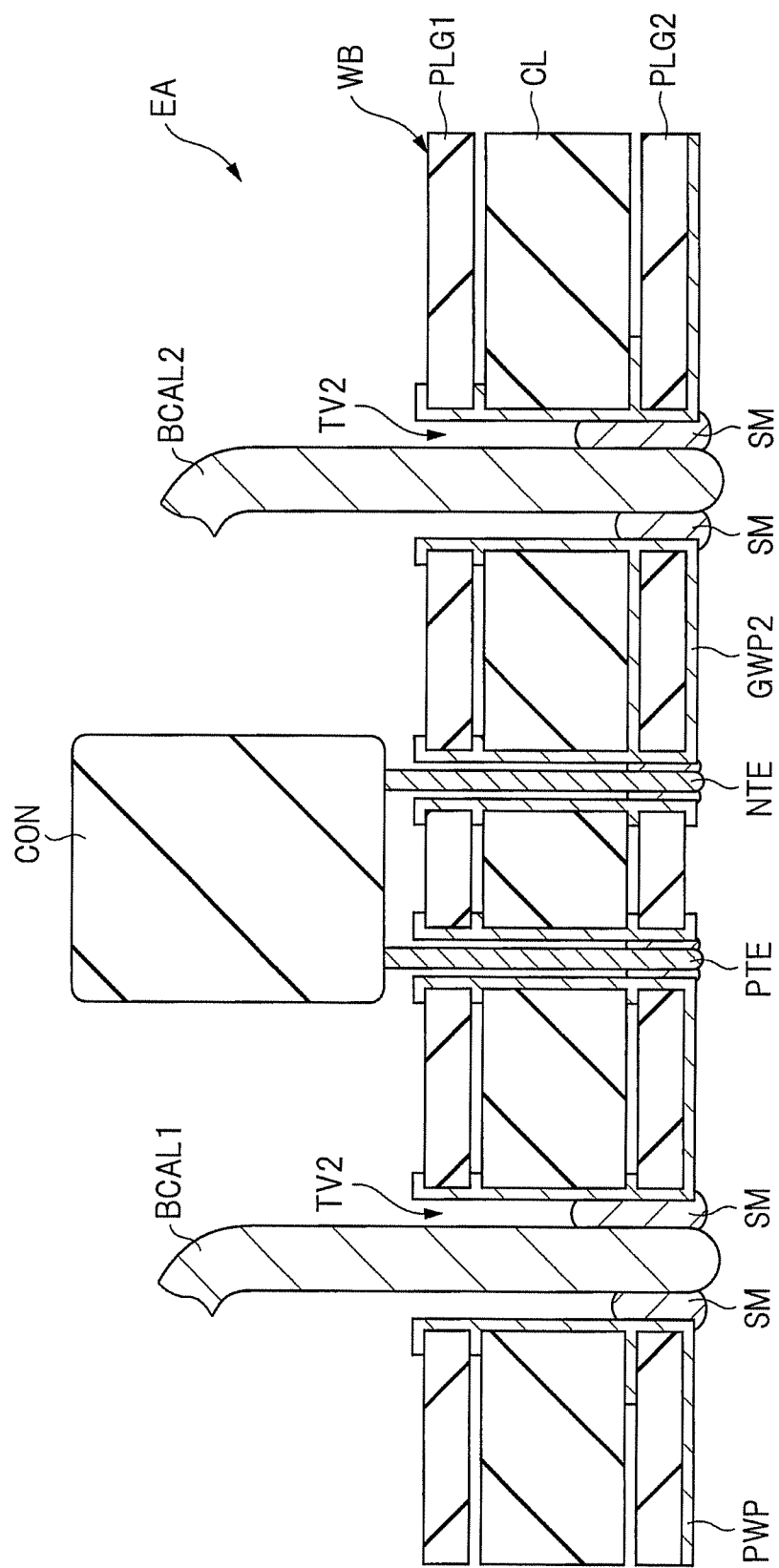
FIG. 18 is a cross-sectional view cut along a line C-C in FIG. 12.

Subsequently, FIG. 18 is a cross-sectional view taken along a line C-C in FIG. 12. As shown in FIG. 18, in the through hole board WB, a pair of through hole vias TV2 are formed away from each other. In this case, a left through hole via TV2 of the pair of through hole vias TV2 is connected to the power supply wiring pattern PWP formed on the back surface of the through hole board WB, and the power supply cable BCAL1 is inserted into the left through hole via TV2. The power supply cable BCAL1 inserted in the left through hole via TV2 is soldered to the back surface of the through hole board WB by the solder material SM.

On the other hand, a right through hole via TV2 of the pair of through hole vias TV2 is connected to the ground wiring pattern GWP2 formed on the back surface of the through hole board WB, and the power supply cable BCAL2 inserted into the right through hole via TV2. The power supply cable BCAL2 inserted in the right through hole via TV2 is soldered to the back surface of the through hole board WB by the solder material SM.

Further, on the front surface side of the through hole board WB, the capacitor CON having a positive terminal PTE and a negative terminal NTE is mounted between the pair of through hole vias TV2. The positive terminal PTE of the capacitor CON is inserted in the through hole board WB and is soldered to the back surface of the through hole board WB by the solder material SM. As a result, as shown in FIG. 18, the positive terminal PTE of the capacitor CON is electrically connected to the power supply cable BCAL1 and the power supply wiring pattern PWP. On the other hand, the negative terminal NTE of the capacitor CON is also inserted in the through hole board WB and is soldered to the back surface of the through hole board WB by the solder material SM. As a result, as shown in FIG. 18, the negative terminal NTE of the capacitor CON is electrically connected to the power supply cable BCAL2 and the ground wiring pattern GWP2.

<Features of Embodiment>

Subsequently, the features of the present embodiment will be explained. As a premise of the first feature of the present embodiment, for example, the electronic components are mounted on both of the front surface and the back surface of the through hole board WB as shown in FIG. 4 to FIG. 6. Based on this premise, in the first feature of the present embodiment, for example, the electronic components which are the constituent elements of the control circuit are mounted in the region AR on the front surface of the through hole board WB as shown in FIG. 8 while only the electronic components which are the constituent elements of the power circuit are mounted in the power circuit region PR2 on the back surface of the through hole board WB as shown in FIG. 11.

More specifically, in the first feature of the present embodiment, the microprocessor MCU, the pre-drivers PD1 to PD3, the gate resistance element, and others, which are the constituent elements of the control circuit, are mounted in the region AR on the front surface overlapping the power circuit region PR2 of the back surface in a plan view, and a plurality of power modules PM and the shunt resistance element SR which are the constituent elements of the power circuit in which a load current flows are mounted in the power circuit region PR2 on the back surface.

Therefore, first, the electronic components can be mounted on both of the front surface and the back surface of the through hole board WB, and therefore, for example, the electronic device EA can be downsized in comparison with the configuration in which the power system electronic components and the control system electronic components are mounted on one-side surface (lower surface) of the wiring board as described in, for example, Patent Document 1.

Particularly, according to the first feature of the present embodiment, the electronic device EA can be downsized while the electrical characteristics of the electronic device EA are improved. This is because, according to the first feature of the present embodiment, only the electronic components constituting the power circuit in which the load current flows are mounted in the power circuit region PR2 partitioned on the back surface of the through hole board WB. More specifically, for example, even in the case of the mounting of the electronic components on both surfaces of the through hole board WB, if the gate resistance and the pre-drivers PD1 to PD3 constituting the control circuit together with the electronic components constituting the power circuit in which the load current flows are mounted in the power circuit region PR2, the size of the power circuit region PR2 is necessarily large because the number of components is increased. When not only the electronic components constituting the power circuit but also the electronic components constituting the control circuit are mounted in the power circuit region PR2, leading of wires is necessary. As a result, the layout of the wiring is complicated. For this reason, the current path of the load current in the power circuit region PR2 becomes longer than necessary. This means that the parasitic inductance in the current path through which the load current flows increases. In this manner, noises are easily superimposed on the load current, resulting in the performance degradation of the electronic device EA.

On the other hand, according to the first feature of the present embodiment, only the electronic components constituting the power circuit in which the load current flows are mounted in the power circuit region PR2 partitioned on the back surface of the through hole board WB. More specifically, in the present embodiment, only the electronic components in which the load current flows are arranged in the power circuit region PR2, the number of components mounted in the power circuit region PR2 can be reduced to be the minimum required. In this manner, the excessive leading of wires is suppressed. As a result, the current path for the load current in the power circuit region PR2 can be shortened. This means that the parasitic inductance in the current path in which the load current flows decreases, which means that the noises are difficult to be superimposed on the load current. Therefore, according to the electronic device EA of the present embodiment, a load current whose noises are less can be supplied to the load (motor MOT). More specifically, according to the electronic device EA of the present embodiment, the performance of the electronic device EA can be improved since the electronic device EA can supply the load current whose noises are less.

From the above description, according of the first feature in the present embodiment, a remarkable effect of capable of reducing the size of the electronic device EA can be obtained while the performance of the electronic device EA is improved.

According to the first feature of the present embodiment, while the microprocessor MCU is mounted on the front surface of the through hole board WB, the electronic components constituting the power circuit are mounted on the back surface opposite to the front surface. Therefore, according to the first feature of the present embodiment, the adverse effect on the microprocessor MCU from the electronic components constituting the power circuit can be suppressed while downsizing the electronic device EA. More specifically, the first feature of the present embodiment means that the microprocessor MCU is difficult to be affected by the noises generated from the power circuit handling the load current which is a large current. In this manner, according to the electronic device EA of the present embodiment, a malfunction of the microprocessor MCU caused by the noises generated from the power circuit can be suppressed. In consideration of this point, the first feature of the present embodiment is advantageous in that not only the downsizing of the electronic device EA but also the improvement of the reliability of the electronic device EA can be achieved while the performance of the electronic device EA is improved.

In the above-described first feature of the present embodiment, particularly, the number of components can be reduced by the mounting of only the electronic components which are constituent elements of the power circuit in the power circuit region PR2. As a result, unnecessary leading of the wires in the power circuit region PR2 is suppressed.

Therefore, with the premise of the first feature in which only the minimally-required electronic components are mounted in the power circuit region PR2, the present inventors advance the studies so as to make such development as connecting the minimally-required electronic components in a wiring layout with the minimum area size. More specifically, with the premise of the first feature, the second feature of the present embodiment is to achieve the layout of the power circuit region PR2 with the minimum area size while ensuring the current capacity. This point will be described below.

The second feature of the present embodiment is to, for example, lay out the power circuit region PR2 as shown in FIG. 12. More specifically, in the power circuit region PR2, three high-side power modules PM1A to PM3A are arranged side by side in the x direction so as to be closer to the power supply wiring pattern PWP in a region between the power supply wiring pattern PWP and the ground wiring pattern GWP extending in the x direction in parallel, and three low-side power modules PM1B to PM3B are arranged side by side in the x direction so as to be closer to the ground wiring pattern GWP therein. The conductive patterns MP1 to MP3 are formed at positions sandwiched between the three high-side power modules PM1A to PM3A and the three low-side power modules PM1B to PM3B. Further, the "protruding unit" is provided at the left end portion of the power supply wiring pattern PWP, the ground wiring pattern GWP2 is formed at a position facing this "protruding unit", and the ground wiring pattern GWP2 and the ground wiring pattern GWP are connected to each other via the shunt resistance element SR.

In this manner, the layout with the smallest area which is the second feature of the present embodiment is achieved. This means that the layout capable of shortening the current path in which load current flows can be achieved in the power circuit region PR2. As a result, according to the second feature of the present embodiment, the parasitic inductance in the current path in which the load current flows can be reduced. In this manner, the noises can be difficult to be superimposed on the load current. Therefore, according to the electronic device EA of the present embodiment, a load current whose noises are small can be supplied to the load. Particularly, in the electronic device EA according to the present embodiment, the performance of the electronic device EA can be significantly improved by the synergistic effect of the first feature and the second feature.

Furthermore, according to the second feature of the present embodiment, the layout with the minimum area is achieved in the power circuit region PR2. As a result, the electronic device EA can be downsized.

The second feature of the present embodiment is to achieve the layout of the power circuit region PR2 as the layout with the minimum area, and this layout with the minimum area is achieved by development for the through hole board WB. More specifically, the layout with the minimum area can be achieved only after the development for the through hole board WB is achieved. Regarding this point, the development for the through hole board WB is the third feature of the present embodiment, and this third feature will be explained below.

The third feature of the present embodiment is to, for example, form a plurality of through hole vias (TV1, TV2, TV3) having different structures in the through hole board WB as shown in FIG. 7. In this manner, as shown in FIG. 12, the layout of the power circuit region PR2 can be made as the layout with the minimum area. More specifically, first, in FIG. 12, the through hole via TV1 is formed at the position close to each of the gate terminals (GT1A to GT3A, GT1B to GT3B) of the six power modules PM. As a result, when the gate terminal and the through hole via TV1 are connected, it is not required to form a leading wire in the power circuit region PR2, so that the area of the wiring layout can be reduced. More specifically, the through hole via TV1 is arranged at the position close to the gate terminal of each of the six power modules PM, and the gate terminal and the through hole via TV1 are connected to each other so as to have a short distance.

Here, for example, when attention is paid to the high-side power module PM1A of the six power modules PM, the gate terminal GT1A of the high-side power module PM1A is connected to the through hole via TV1 which is arranged close to the gate terminal as shown in FIG. 16. On the front surface of through hole board WB, the through hole via TV1 and the gate resistance element GR are electrically connected to each other, and this gate resistance element GR is electrically connected to the pre-driver PD1. As a result, the high-side power module PM1A arranged on the back surface of the through hole board WB is controlled via the through hole via TV1 by the pre-driver PD1 arranged on the front surface of the through hole board WB. As a result, according to the present embodiment, by the appropriate usage of the through hole via TV1 formed in the through hole board WB, the switching of the high-side power module PM1A can be controlled without providing the gate resistance element GR and the pre-driver PD1 on the back surface of the through hole board WB. More specifically, because of the arrangement of the through hole via TV1 in the through hole board WB, the switching of the high-side power module PM1A can be controlled by the pre-driver PD1 while achieving the first feature which is the mounting of only the electronic components constituting the power circuit in the power circuit region PR2 and the second feature which is the formation of the layout of the power circuit region PR2 as the layout with the minimum area.

Particularly, as shown in FIG. 16, by the through hole via TV1, the gate terminal GT1A of the high-side power module PM1A mounted on the back surface of the through hole board WB and the pre-driver PD1 mounted on the front surface of the through hole board WB are electrically connected to each other. This case does not require the leading of the wire in comparison with the case of using a wiring layer inside the through hole board WB. Therefore, the connection distance between the gate terminal GT1A of the high-side power module PM1A and the pre-driver PD1 can be shortened. Therefore, according to the present embodiment, the parasitic inductance between the gate terminal GT1A and the pre-driver PD1 can be reduced. As a result, deterioration of the waveform of the control signal output from the pre-driver PD1 can be suppressed, and the reliability of the switching control of the high-side power module PM1A by the pre-driver PD1 can be improved.

Subsequently, as shown in FIG. 12, each of the conductive patterns MP1 to MP3 is connected to the through hole via TV2. The size of this through hole via TV2 is larger than the size of through hole via TV1, and is configured so that a cable can be inserted therein. As a result, as shown in, for example, FIG. 17, a cable CAL(V) and the conductive pattern MP2 can be electrically connected to each other when the cable CAL(V) is inserted into the through hole via TV2 and is soldered with the solder material SM. More specifically, by the appropriate usage of the through hole vias TV2 formed in the through hole board WB, the conductive patterns (MP1, MP2, MP3) and the load can be electrically connected to each other without increasing each area of the conductive patterns (MP1, MP2, MP3) formed on the back surface of the through hole board WB. More specifically, the through hole via TV2 is connected to each of the conductive patterns (MP1, MP2, MP3), and each of the cables (CAL(U), CAL(V), CAL(W)) connected to the load is inserted into and are soldered to the through hole via TV2, so that the conductive patterns (MP1, MP2, MP3) and the load can be electrically connected to each other with the conductive patterns (MP1, MP2, MP3) having the minimally-required area.

For example, as shown in FIG. 18, by the insertion and the soldering of the power supply cable BCAL1 into the through hole via TV2 with the solder material SM, the power supply cable BCAL1 and the power supply wiring pattern PWP can be electrically connected to each other. Similarly, by the insertion and the soldering of the power supply cable BCAL2 into the through hole via TV2 with the solder material SM, the power supply cable BCAL2 and the ground wiring pattern GWP2 can be electrically connected to each other.

As described above, by the provision of the through hole via TV2 in the through hole board WB, the electrical connection between the conductive patterns (MP1, MP2, MP3) and the load, the electrical connection between the power supply cable BCAL1 and the power supply wiring pattern PWP, and the electrical connection between the power supply cable BCAL2 and the ground wiring pattern GWP2 can be achieved while achieving the layout with the minimally-required area (which is the second feature).

Subsequently, as shown in FIG. 12, the power supply wiring pattern PWP, the conductive patterns MP1 to MP3, and the ground wiring pattern GWP are connected to a plurality of through hole vias TV3, respectively. In this case, for example, as shown in FIG. 15 and FIG. 17, the inside of the through hole via TV3 is filled with a conductive member CM having a favorable thermal conductivity. Therefore, according to the present embodiment, the heat generated in the power circuit region PR2 on the back surface of the through hole board WB can be efficiently dissipated from the through hole via TV3. Particularly, when the layout area of the power circuit region PR2 is formed as the minimum area by the second embodiment of the present embodiment while ensuring the current capacity, there is a concern about a large generated heat amount per unit area. With regard to this point, in the present embodiment, the through hole via TV3 for the heat dissipation connected to the power circuit region PR2 is provided, and therefore, the heat generated in the power circuit region PR2 can be efficiently dissipated from the through hole via TV3. Therefore, according to the present embodiment, by the provision of the through hole via TV3 in the through hole board WB, the reliability of the electronic device EA can be improved while achieving the layout with the minimum area (which is the second feature).

Further, as shown in FIG. 12, the through hole via TV3 is also formed at the position overlapping each of the drain terminals (DT1A to DT3A, DT1B to DT3B) of the power module PM in a plan view. In other words, the through hole via TV3 is formed so as to be in direct contact with each of the drain terminals (DT1A to DT3A, DT1B to DT3B) of the power module PM. Therefore, the heat can be dissipated from the through hole via TV3 directly connected to each of the drain terminals (DT1A to DT3A, DT1B to DT3B) of the power module PM which is a source of generation of heat. More specifically, the through hole via TV3 is formed at the position overlapping each of the drain terminals (DT1A to DT3A, DT1B to DT3B) of the power module PM in a plan view, so that the heat generated from the power circuit region PR2 can be efficiently dissipated from the through hole via TV3.

Particularly, as seen from FIG. 10 and FIG. 11, the power circuit region PR1 of the wiring layer L3 as shown in FIG. 10 and the power circuit region PR2 of the wiring layer L4 as shown in FIG. 11 have a region overlapping each other in a plan view, and the power circuit region PR1 of the wiring layer L3 and the power circuit region PR2 of the wiring layer L4 are connected to each other by the through hole via TV3 although not shown in FIG. 10 and FIG. 11.

More specifically, for example, in FIG. 12, the through hole via TV3 connected to each of the drain terminals (DT1A to DT3A) of the power module (PM1A to PM3A) is connected to the wiring pattern WP6 shown in FIG. 10. As a result, the heat generated in the power modules (PM1A to PM3A) can be efficiently dissipated through a heat dissipation path such as "the drain terminals (DT1A to DT3A) of the power modules (PM1A to PM3A)→the through hole via TV3→the wiring pattern WP6".

Further, the wiring pattern WP6 as shown in FIG. 10 is connected to both of the through hole vias TV3 connected to the power supply wiring pattern PWP as shown in FIG. 12 and the through hole vias TV3 connected to the drain terminals (DT1A to DT3A) as shown in FIG. 12. Therefore, for example, in FIG. 12, there are a plurality of current paths for the currents flowing between the power supply wiring pattern PWP and the drain terminal DT1A of the power module PM1A. More specifically, the current paths include not only the first path such as "the power supply wiring pattern PWP→the drain terminal DT1A of the power module PM1A" but also the second path such as "the power supply wiring pattern PWP→the through hole via TV3 connected to the power supply wiring pattern PWP→the wiring pattern WP6 (see FIG. 10)→the through hole via TV3 connected to the drain terminal DT1A→the drain terminal DT1A of the power module PM1A". As a result, according to the present embodiment, because of the existence of three-dimensional current paths such as the first path and the second path, a large current capacity can be ensured even in forming the layout area of the power circuit region PR2 as the minimum area as shown in FIG. 12.

Subsequently, the fourth feature of the present embodiment is to, for example, mount the power module PM on the back surface of the through hole board WB as shown in FIG. 6. More specifically, when the electronic components are mounted on both surfaces of the through hole board WB, a case of mounting the power module PM on the front surface of the through hole board WB can be also considered. In this regard, in the present embodiment, the power module PM is mounted on the back surface of the through hole board WB because of the following reasons.

Figure 19:
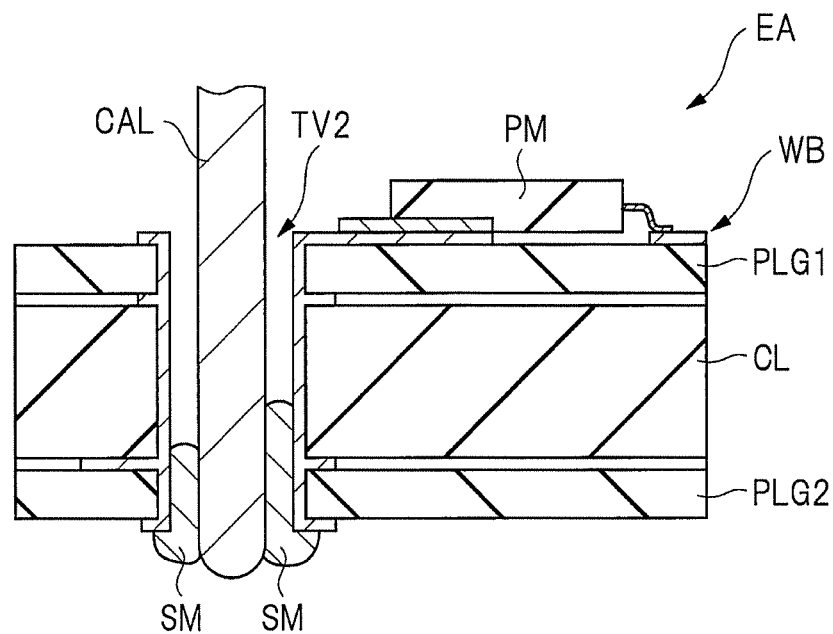
FIG. 19 is a cross-sectional view showing a configuration in which a power module is mounted on the front surface of the through hole board.

For example, FIG. 19 is a cross-sectional view showing the configuration in which the power module PM is mounted on the front surface of the through hole board WB. As shown in FIG. 19, the power module PM is mounted on the front surface of the through hole board WB. A through hole via TV2 is formed in the through hole board WB, and the through hole via TV2 and the power module PM are electrically connected to each other. The cable CAL is inserted into the through hole via TV2, and the cable CAL inserted into the through hole via TV2 is soldered with the solder material SM onto the back surface of the through hole board WB.

In this case, the solder material SM is wetly spread from the back surface of the through hole board WB to the inside of the through hole via TV2. However, usually, the solder material SM does not reach the front surface of the through hole board WB. As shown in FIG. 19, this case has a portion where the electrical connection between the power module PM and the cable CAL is made only with the plating film formed on the inner wall of the through hole via TV2, and therefore, a connection resistance between the power module PM and the cable CAL becomes large.

Furthermore, a degree of the wet spreading of the solder material SM varies among a plurality of electronic devices (products), and therefore, the connection resistance between the power module PM and the cable CAL varies among the plurality of electronic devices. This means that it is difficult to achieve uniform performance among the plurality of electronic devices (products).

Figure 20:
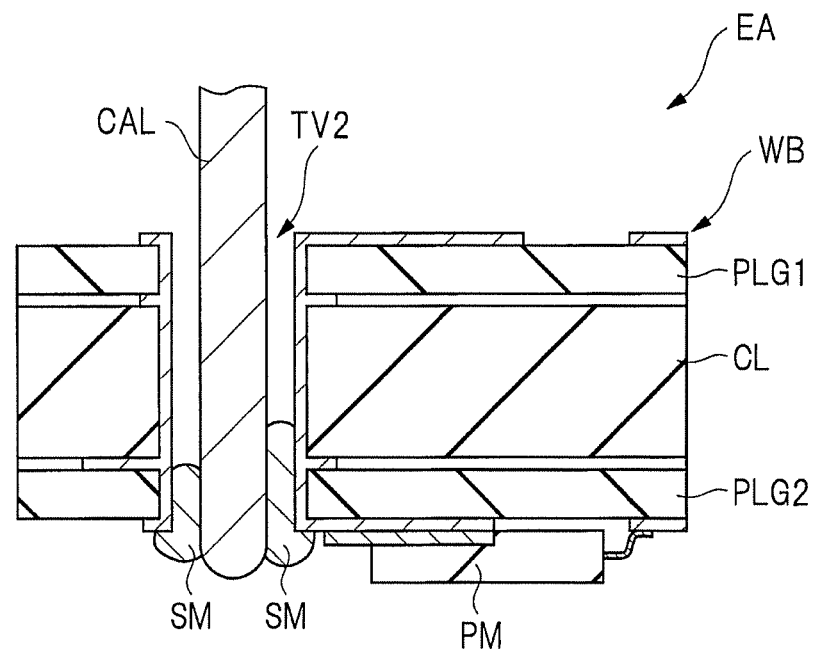
FIG. 20 is a cross-sectional view showing a configuration in which a power module is mounted on the back surface of the through hole board.

On the other hand, FIG. 20 is a cross-sectional view showing the configuration in which the power module PM is mounted on the back surface of the through hole board WB. As shown in FIG. 20, the power module PM is mounted on the back surface of the through hole board WB. A through hole via TV2 is formed in the through hole board WB, and the through hole via TV2 and the power module PM are electrically connected to each other. The cable CAL is inserted in the through hole via TV2, and the cable CAL inserted in the through hole via TV2 is soldered with the solder material SM onto the back surface of the through hole board WB.

In this case, when the power module PM is mounted on the back surface of the through hole board WB as shown in FIG. 20, there is no portion where the electrical connection between the power module PM and the cable CAL is made only with the plating film formed on the inner wall of the through hole via TV2 even if the solder material SM does not wetly spread to the front surface of the through hole board WB. As a result, the connection resistance between the power module PM and the cable CAL becomes small.

Further, even if the spreading of the solder material SM varies among a plurality of electronic devices (products), the connection resistance between the power module PM and the cable CAL is difficult to vary among the plurality of electronic devices in the configuration as shown in FIG. 20. In this manner, it is easy to achieve the uniform performance among the plurality of electronic devices (products) in the configuration which is adopted in the present embodiment in which the power module PM is mounted on the back surface of the through hole board WB.

Mores specifically, the fourth feature of the present embodiment in which the power module PM is mounted on the back surface of the through hole board WB can obtain an advantage of not being affected by adverse effects such as the increase of the connection resistance and the variation of the connection resistance between the power module PM and the cable CAL, even if the solder material SM used for soldering of the cable CAL inserted into the through hole via TV2 does not wetly spread to the front surface of the through hole board WB.

Therefore, according to the fourth feature of the present embodiment, the connection resistance between the cable CAL inserted in the through hole via TV2 and the power module PM can be reduced. As a result, the performance of the electronic device EA can be improved. Furthermore, since the generation of Joule heat generated by the connection resistance between the cable CAL inserted in the through hole via TV2 and the power module PM is also suppressed, the amount of heat generated from the electronic device EA can be reduced. Therefore, according to the fourth feature of the present embodiment, the reliability of the electronic device EA can be improved in terms of heat, and the generation of unnecessary power consumption can be suppressed, so that an inverter efficiency can be improved.

Subsequently, the fifth feature of the present embodiment is to provide the control circuit region where the control circuit is formed and the power circuit region where the power circuit is formed so as to partition and separate them from each other. Therefore, the heat generated in the power circuit faulted in the power circuit region can be suppressed from adversely affecting the control circuit formed in the control circuit region. Furthermore, the electrical noises generated in the power circuit formed in the power circuit region can be suppressed from adversely affecting the control circuit formed in the control circuit region.

More specifically, FIGS. 21A to 21D are diagrams each schematically showing a wiring layer existing in the through hole board WB.

Figure 21A:
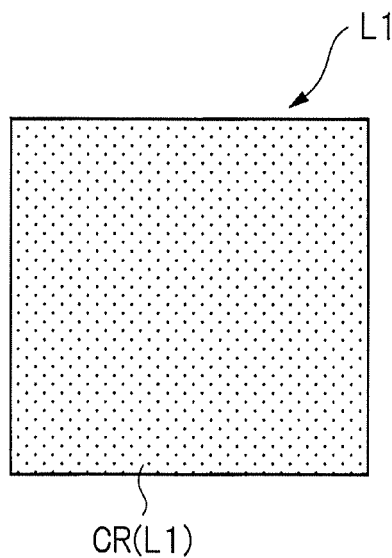
FIG. 21A is a diagram showing a first wiring layer formed in the front surface of the through hole board.

Particularly, FIG. 21A shows a wiring layer (the wiring layer for the control circuit) L1 formed on the front surface of the through hole board WB, and this wiring layer L1 is a control circuit region CR(L1) where the control circuit is formed. For example, as shown in FIG. 8, the microprocessor MCU and the pre-drivers PD1 to PD3 constituting the control circuit are mounted in this control circuit region CR(L1).

Figure 21B:
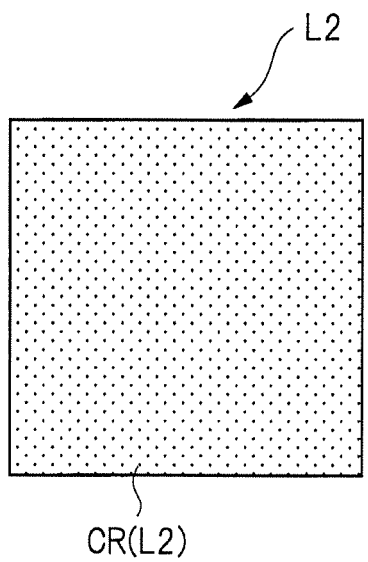
FIG. 21B is a diagram showing a second wiring layer formed in a lower layer of the first wiring layer.

Subsequently, FIG. 21B shows a wiring layer (the wiring layer for the control circuit) L2 formed below the wiring layer L1, and this wiring layer L2 is a control circuit region CR(L2) where the control circuit is formed. For example, as shown in FIG. 9, the wiring patterns (WP1, WP2, WP3, WP4) for forming the control circuit are formed in this control circuit region CR(L2).

Figure 21C:
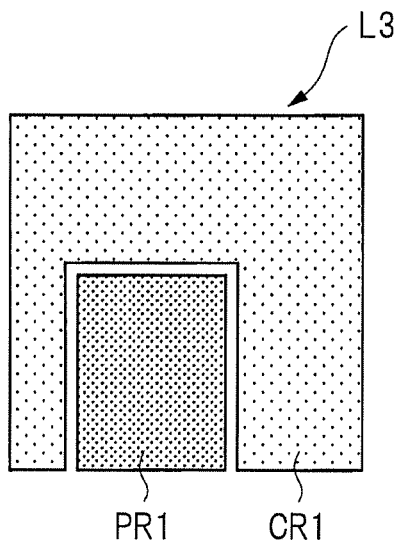
FIG. 21C is a diagram showing a third wiring layer formed in a lower layer of the second wiring layer.

Subsequently, FIG. 21C shows a wiring layer (the wiring layer for the power circuit+the wiring layer for the control circuit) L3 formed below the wiring layer L2, and this wiring layer L3 includes the control circuit region CR1 where the control circuit is formed and the power circuit region PR1 where the power circuit is formed. In this case, the control circuit region CR1 and the power circuit region PR1 are provided so as to be spaced apart from each other. In other words, a dead space is provided in the border region between the control circuit region CR1 and the power circuit region PR1. For example, as shown in FIG. 10, the wiring pattern (WP5) for forming the control circuit is formed in the control circuit region CR1. On the other hand, for example, the wiring patterns (WP6, WP7) for forming the power circuit are formed in the power circuit region PR1.

Figure 21D:
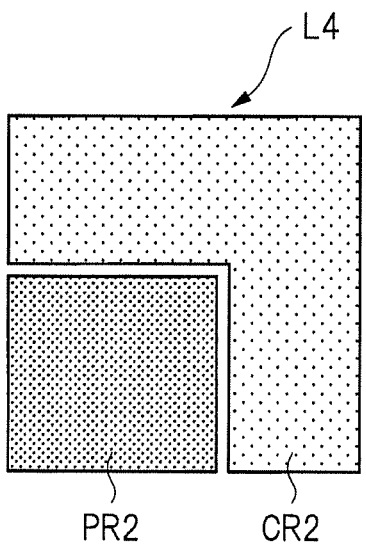
FIG. 21D is a diagram showing a fourth wiring layer formed in the back surface of the through hole board.

Further, FIG. 21D shows the wiring layer (the wiring layer for the power circuit+the wiring layer for the control circuit) L4 formed on the back surface of the through hole board WB, and this wiring layer L4 includes the control circuit region CR2 where the control circuit is formed and the power circuit region PR2 where the power circuit is formed. In this case, the control circuit region CR2 and the power circuit region PR2 are provided so as to be spaced apart from each other. In other words, a dead space is provided in the border region between the control circuit region CR2 and the power circuit region PR2. As shown in FIG. 11, the regulators REG1, REG2 constituting the control circuit are mounted on the control circuit region CR2. On the other hand, the shunt resistance SR and the six power modules PM constituting the power circuit are mounted on the power circuit region PR2.

As described above, the power circuit regions (PR1, PR2) and the control circuit regions (CR(L1), CR(L2)) are formed indifferent layers from each other, and therefore, are easy to be thermally and electrically separated from each other. Particularly, in the present embodiment, the core layer CL (see FIG. 7) is formed between the power circuit regions (PR1, PR2) and the control circuit regions (CR(L1), CR(L2)) in the thickness direction of the through hole board WB, and the thickness of the core layer CL is larger than the thickness of the prepreg layer PLG1 and the thickness of the prepreg layer PLG2 (see FIG. 7). As a result, according to the present embodiment, the power circuit regions (PR1, PR2) and the control circuit regions (CR(L1), CR(L2)) are separated from each other in the layers by the thick core layer CL. Therefore, the heat generated by the electronic component (power module PM) formed in the power circuit region (PR2) is suppressed from adversely affecting the electronic components (the microprocessor MCU or others) formed in the control circuit region (CR(L1)). Furthermore, the heat which is locally generated by the electronic components (the power modules PM) formed in the power circuit region (PR2) is efficiently dissipated to the entire through hole board WB by the wiring pattern having the large area formed in the wiring layer L2 and the wiring layer L3. On the other hand, also in the wiring layer L3 and the wiring layer L4, a dead space is provided in the border region between the control circuit region CR1 (CR2) and the power circuit region PR1 (PR2). Therefore, the heat conduction between the control circuit region CR1 (CR2) and the power circuit region PR1 (PR2) can also be suppressed.

According to the fifth feature of the present embodiment, the heat generated by the power circuit can be effectively suppressed from adversely affecting the control circuit by the synergistic effect among the feature of providing the control circuit regions (CR(L1), CR(L2), CR1, CR2) and the power circuit regions (PR1, PR2) so as to be partitioned and separated from each other, the feature of increasing the thickness of the core layer CL, and the feature of providing the wiring pattern having the large area in the wiring layer L2 and the wiring layer L3. As a result, according to the fifth feature of the present embodiment, the reliability of the electronic device EA can be improved.

Further, for example, the wiring patterns (WP3, WP4) each having the large area to which the ground potential (reference potential) is supplied are formed in the wiring layer L2 as shown in FIG. 9, and the wiring pattern (WP5) having the large area to which the ground potential (reference potential) is supplied is formed in the wiring layer L3 as shown in FIG. 10. Therefore, for example, electromagnetic noises generated by the power module PM mounted on the back surface of the through hole board WB as shown in FIG. 11 are shielded by the wiring patterns (WP3, WP4, WP5). Therefore, the adverse effect of the electromagnetic noises on the electronic component (the microprocessor MCU) mounted on the front surface of the through hole board WB shown in FIG. 8 is suppressed. Therefore, according to the fifth feature of the present embodiment, the reliability of the electronic device EA can be improved from not only a thermal viewpoint but also an electrical viewpoint.

Subsequently, the sixth feature of the present embodiment is to electrically connect the ground potential (reference potential) of the power circuit and the ground potential (reference potential) of the control circuit with a high impedance. Therefore, according to the present embodiment, the influence of the noises (including fluctuation of the noises) generated in the ground potential of the power circuit on the ground potential of the control circuit is reduced, and, as a result, the stability of the ground potential of the control circuit can be improved. This means that the malfunction of the control circuit due to the fluctuation of the ground potential of the power circuit can be suppressed, so that the reliability of the electronic device EA can be improved.

Hereinafter, more specifically, an example of the configuration in which the ground potential of the power circuit and the ground potential of the control circuit are electrically connected to each other with a high impedance will be described.

Figure 22A:
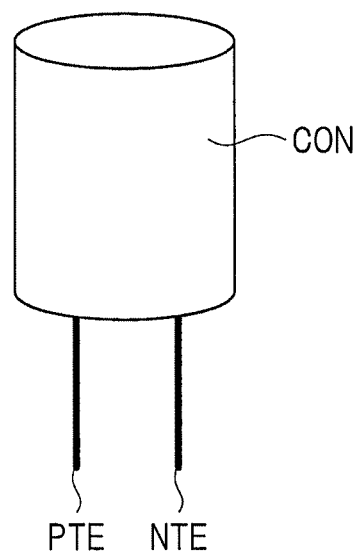
FIG. 22A is a diagram showing a schematic configuration of a capacitor.

FIG. 22A is a diagram showing a schematic configuration of a capacitor CON formed of an electrolytic capacitor. As shown in FIG. 22A, a positive terminal PTE and a negative terminal NTE are provided in the capacitor CON. In this case, the ground potential is supplied to the negative terminal NTE of the capacitor CON.

Figure 22B:
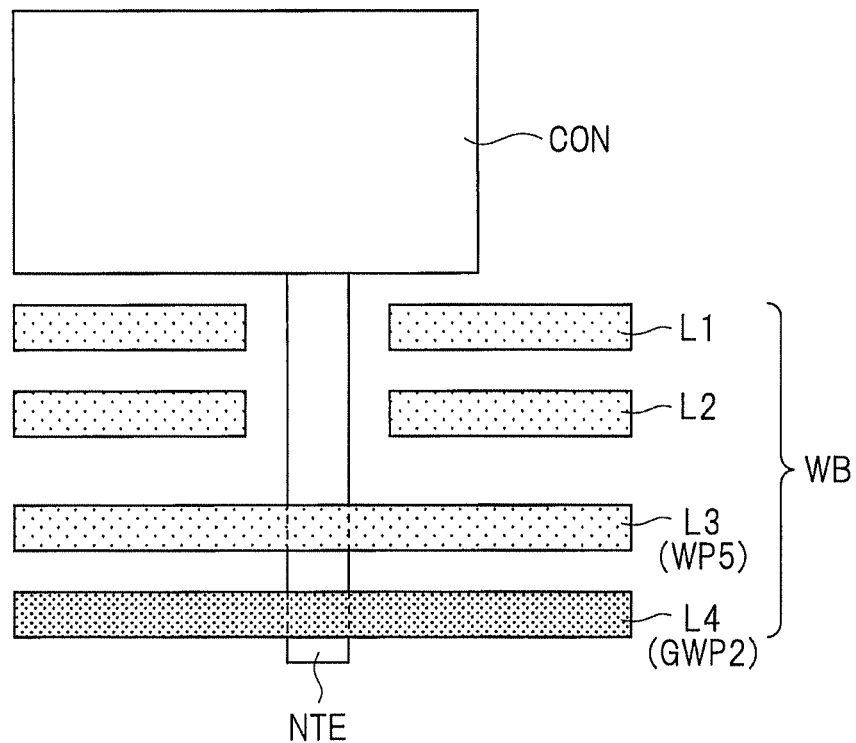
FIG. 22B is a diagram schematically showing a state of mounting of the capacitor on the front surface of the through hole board.

FIG. 22B is a diagram schematically showing a state of the mounting of the capacitor CON on the front surface of the through hole board. As shown in FIG. 22B, the through hole board WB includes the wiring layer L1, the wiring layer L2, the wiring layer L3, and the wiring layer L4, and the negative terminal NTE of the capacitor CON is inserted into the through hole board WB. In this case, as shown in FIG. 22B, the negative terminal NTE of the capacitor CON is not connected to the wiring layer L1 and the wiring layer L2 but connected to the wiring layer L3 and the wiring layer L4. More specifically, for example, the wiring pattern WP5 to which the ground potential for the control circuit shown in FIG. 10 is supplied and the ground wiring pattern GWP2 to which the ground potential for the power circuit shown in FIG. 12 is supplied are connected to each other only at a pinpoint of the negative terminal NTE of the capacitor CON as shown in FIG. 22B. Therefore, according to the present embodiment, the ground potential of the power circuit and the ground potential of the control circuit can be electrically connected with a high impedance.

Further, for example, as shown in FIG. 12, the present embodiment has an advantage in that the negative terminal of the capacitor CON is electrically connected to not the ground wiring pattern GWP but the ground wiring pattern GWP2. This is because, for example, in FIG. 12, the load current flows from the ground wiring pattern GWP through the shunt resistance element SR to the ground wiring pattern GWP2. In this case, since the load current flows through the shunt resistance element SR, a voltage drop occurs in the shunt resistance element SR. This means that, when the load current flows, the potential of the ground wiring pattern GWP becomes a positive potential based on the ground wiring pattern GWP2 of "0 V" electrically connected to the negative electrode of the battery. Therefore, for example, when the negative terminal of the capacitor CON is electrically connected to not the ground wiring pattern GWP2 but the ground wiring pattern GWP, the ground potential for the control circuit in the wiring pattern WP5 (the wiring layer L3) electrically connected to the negative terminal of the capacitor CON also becomes a positive potential. This means that the fluctuation caused in the ground potential of the power circuit also affects the ground potential of the control circuit.

On the other hand, according to the present embodiment, for example, as shown in FIG. 12, the negative terminal of the capacitor CON is electrically connected to not the ground wiring pattern GWP but the ground wiring pattern GWP2. Therefore, even when the load current flows from the ground wiring pattern GWP through the shunt resistance element SR to the ground wiring pattern GWP2, the potential of the ground wiring pattern GWP2 electrically connected to the negative terminal of the battery is maintained at "0 V". As a result, according to the present embodiment, even if the load current flows, the ground potential for the control circuit in the wiring pattern WP5 electrically connected to the negative terminal of the capacitor CON does not become the positive potential. Therefore, from the viewpoint of suppressing the fluctuation in the ground potential for the control circuit, it is understood that it is effective to electrically connect the ground potential of the power circuit to the ground potential of the control circuit with a high impedance, and to electrically connect the negative terminal of the capacitor CON to not the ground wiring pattern GWP but the ground wiring pattern GWP2.

<Verification of Effects According to Embodiment>

Subsequently, a verification result indicating that the electronic device EA of the present embodiment has an excellent effect more than that of a conventional product will be described.

Figure 23:
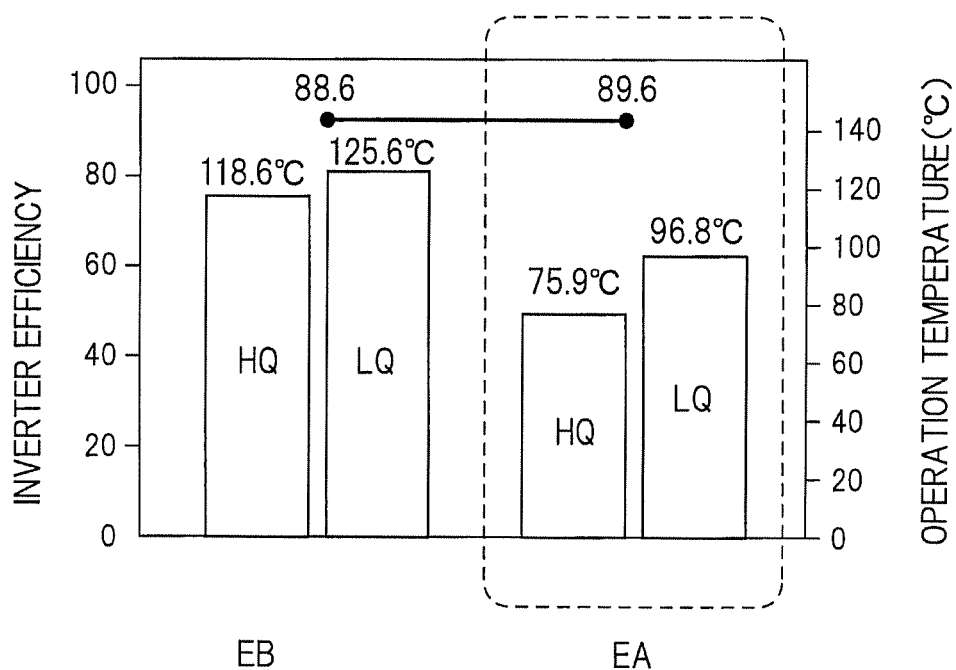
FIG. 23 is a graph showing a result of comparison between the electronic device according to the embodiment and a trial product using a six-layer IVH board.

FIG. 23 is a graph showing a result of comparison between the "electronic device EA" according to the embodiment and a "trial product EB" using a six-layer IVH board. Particularly, FIG. 23 shows results of comparison in an inverter efficiency and comparison between the operation temperature of the high-side power transistor HQ and the operation temperature of the low-side power transistor LQ.

First, when attention is paid to the inverter efficiency, the inverter efficiency of the "electronic device EA" is "89.6%" while the inverter efficiency of the "trial product EB" is "88.6%". Therefore, it is understood that the "electronic device EA" has a better inverter efficiency than the "trial product EB". That is, this result has confirmed that the performance can be improved in the "electronic device EA" according to the present embodiment.

Subsequently, when attention is paid to the operation temperature of the high-side power transistor HQ, the operation temperature of the high-side power transistor HQ of the "electronic device EA" is "75.9° C." while "the operation temperature of the high-side power transistor HQ of the "trial product EB" is "118.6° C.". Therefore, it is understood that the "electronic device EA" has a lower operation temperature of the high-side power transistor HQ than the "trial product EB". That is, this result has continued that the heat dissipation characteristics can be improved in the "electronic device EA" according to the present embodiment.

Similarly, when attention is paid to the operation temperature of the low-side power transistor LQ, the operation temperature of the low-side power transistor LQ of the "electronic device EA" is "96.8° C." while the operation temperature of the low-side power transistor LQ of the "trial product EB" is "125.6° C.". Therefore, it is understood that the "electronic device EA" has a lower operation temperature of the low-side power transistor LQ than the "product EB". That is, this result has confirmed that the heat dissipation characteristics can be improved in the "electronic device EA" according to the present embodiment.

Figure 24:
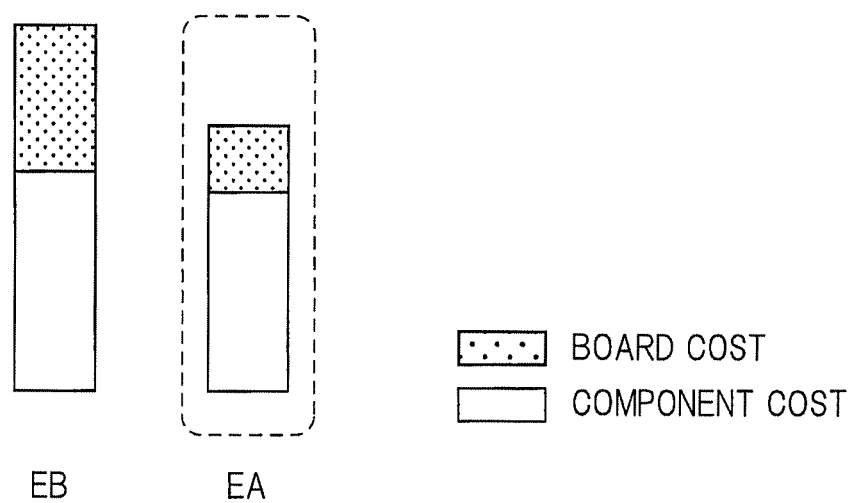
FIG. 24 is a graph showing a result of comparison in view of a production cost between the electronic device according to the present embodiment and a trial product using a six-layer IVH board.

Subsequently, FIG. 24 is a graph showing a result of comparison in the production cost between the "electronic device EA" according to the present embodiment and the "trial product EB" using the six-layer IVH board.

As shown in FIG. 24, it is understood that the component cost of the "electronic device EA" and the component cost of the "product EB" are not greatly different from each other while the board cost of the "electronic device EA" can be greatly reduced as compared with the board cost of the "trial product EB". As a result, it can be understood that the total cost in combination of the component cost with the board cost of the "electronic device EA" is suppressed to be significantly lower than the total cost of the "trial product EB". This result has confirmed that the "electronic device EA" in the present embodiment has superior effects since the manufacturing cost can be reduced while improving the performance.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. An electronic device comprising:
    a through hole board including a plurality of through hole vias having different sizes from each other;
    a first semiconductor device arranged on a back surface of the through hole board and including a power transistor; and
    a second semiconductor device arranged on a front surface of the through hole board opposite to the back surface and including a control circuit for controlling the power transistor,
    wherein the plurality of through hole vias include:
        a first through hole via having a first size;
        a second through hole via which is larger than the first size; and
        a third through hole via having a conductive member embedded inside the third through hole via,
    the first semiconductor device includes:
        a control terminal;
        a first terminal; and
        a second terminal,
    the through hole board includes:
        a first region inside the back surface; and
        a second region inside the front surface, the second region overlapping the first region in a plan view,
    the first semiconductor device is arranged in the first region,
    the second semiconductor device is arranged in the second region,
    the control terminal of the first semiconductor device is electrically connected with the second semiconductor device via the first through hole via,
    the first terminal of the first semiconductor device is electrically connected with the second through hole via, and
    the third through hole via is arranged at a position overlapping the first region in a plan view,
    wherein the through hole board includes:
        a first prepreg layer;
        a core layer arranged in a lower layer of the first prepreg layer; and
        a second prepreg layer arranged in a lower layer of the core layer, and
    each of the plurality of through hole vias penetrates through the first prepreg layer, the core layer, and the second prepreg layer,
    wherein a thickness of the core layer is larger than a thickness of the first prepreg layer, and
    a thickness of the core layer is larger than a thickness of the second prepreg layer.

2. The electronic device according to claim 1,
    wherein the power transistor includes a gate electrode, and
    the second semiconductor device is a pre-driver which controls switching of the power transistor by changing a gate voltage to be applied to the gate electrode.

3. The electronic device according to claim 1,
    wherein, in the second region on the front surface of the through hole board, a gate resistance element is provided to be interposed between the first through hole via and the second semiconductor device.

4. The electronic device according to claim 1,
    wherein a cable is inserted into the second through hole via,
    wherein the first terminal is electrically connected with a load; and
    wherein the second terminal is electrically connected with a fixed potential supply source.

5. The electronic device according to claim 1,
    wherein the through hole board includes:
        a first wiring layer formed on an upper surface of the first prepreg layer;
        a second wiring layer formed on an upper surface of the core layer;
        a third wiring layer formed on a lower surface of the core layer; and
        a fourth wiring layer formed on a lower surface of the second prepreg layer,
    the first wiring layer is a wiring layer for the control circuit constituting the control circuit,
    the second wiring layer is a wiring layer for the control circuit constituting the control circuit,
    the third wiring layer includes a wiring layer for the power circuit constituting the power circuit for supplying a current to the load and a wiring layer for the control circuit separated from the wiring layer for the power circuit, and
    the fourth wiring layer includes the wiring layer for the power circuit constituting the power circuit and the wiring layer for the control circuit separated from the wiring layer for the power circuit.

6. The electronic device according to claim 1,
    wherein the electronic device includes a plurality of the first semiconductor devices,
    the plurality of first semiconductor devices include:
        a high-side first semiconductor device; and
        a low-side first semiconductor device,
    the second region on the back surface of the through hole board is provided with:
        a power supply wiring pattern extending in a first direction;
        a ground wiring pattern extending in the first direction to be spaced apart from the power supply wiring pattern;

the second through hole via provided at a position sandwiched between the power supply wiring pattern and the ground wiring pattern in a second direction intersecting with the first direction;

the high-side first semiconductor device provided at a position sandwiched between the power supply wiring pattern and the second through hole via in the second direction; and the low-side first semiconductor device provided at a position sandwiched between the second through hole via and the ground wiring pattern in the second direction, a first terminal of the high-side first semiconductor device is electrically connected with the second through hole via, a second terminal of the high-side first semiconductor device is electrically connected with the power supply wiring pattern, a first terminal of the low-side first semiconductor device is electrically connected with the second through hole via, and a second terminal of the low-side first semiconductor device is electrically connected with the ground wiring pattern.

7. The electronic device according to claim 1,
wherein the front surface of the through hole board is a surface in which the cable is inserted, and
the back surface of the through hole board is a surface onto the cable is soldered.

8. The electronic device according to claim 1,
the electronic device is a constituent element of an inverter for driving a motor.

9. The electronic device according to claim 1,
wherein the power transistor is a power MOSFET.

10. The electronic device according to claim 5,
wherein the wiring layer for the power circuit formed in the third wiring layer and the wiring layer for the power circuit formed in the fourth wiring layer have a region where the layers overlap each other in a plan view, and
the wiring layer for the power circuit formed in the third wiring layer and the wiring layer for the power circuit formed in the fourth wiring layer are connected with each other by the third through hole via.

11. The electronic device according to claim 6,
wherein the second region on the back surface of the through hole board is formed with:
  a conductive pattern; and
  a resistance element connected between the conductive pattern and the ground wiring pattern,
the power supply wiring pattern is configured to be electrically connected with a positive electrode of a power storage device, and
the conductive pattern is configured to be electrically connected with a negative electrode of the power storage device.

12. The electronic device according to claim 11,
wherein the resistance element is a shunt resistance element for detecting an overcurrent.

13. The electronic device according to claim 11,
wherein a capacitor having a positive terminal and a negative terminal is mounted on the front surface of the through hole board,
the positive terminal of the capacitor penetrates through the through hole board and is connected with the power supply wiring pattern formed on the back surface of the through hole board, and
the negative terminal of the capacitor penetrates through the through hole board and is connected with the conductive pattern formed on the back surface of the through hole board.

14. The electronic device according to claim 13,
wherein the through hole board includes:
  the first prepreg layer;
  the core layer arranged in a lower layer of the first prepreg layer; and
  the second prepreg layer arranged in a lower layer of the core layer,
the through hole board includes:
  a first wiring layer formed on an upper surface of the first prepreg layer;
  a second wiring layer formed on an upper surface of the core layer;
  a third wiring layer formed on a lower surface of the core layer; and
  a fourth wiring layer formed on a lower surface of the second prepreg layer,
a ground wiring pattern for a control circuit is formed in the third wiring layer,
the conductive pattern is formed in the fourth wiring layer, and
the ground wiring pattern for the control circuit is electrically connected with the conductive pattern by the negative terminal of the capacitor.

* * * * *